US012671378B1

(12) United States Patent　　(10) Patent No.: US 12,671,378 B1
　　Aroca　　　　　　　　　　　　　(45) Date of Patent: Jun. 30, 2026

(54) SYSTEMS AND METHODS TO IMPROVE PHOTODIODE AMPLIFICATION OPERATION IN PHOTONIC RECEIVER

(71) Applicant: ACACIA TECHNOLOGY, INC., San Jose, CA (US)

(72) Inventor: Ricardo Aroca, Jersey City, NJ (US)

( * ) Notice: Subject to any disclaimer, the term of this patent is extended or adjusted under 35 U.S.C. 154(b) by 0 days.

(21) Appl. No.: 17/467,053

(22) Filed: Sep. 3, 2021

Related U.S. Application Data

(60) Provisional application No. 63/074,258, filed on Sep. 3, 2020.

(51) Int. Cl.
　　H03F 3/45　　　　(2006.01)
　　G01J 1/44　　　　(2006.01)

(52) U.S. Cl.
　　CPC ............ H03F 3/45475 (2013.01); G01J 1/44 (2013.01)

(58) Field of Classification Search
　　CPC ............................... H03F 3/45475; G01J 1/44
　　See application file for complete search history.

(56) References Cited

U.S. PATENT DOCUMENTS

| | | | | |
|---|---|---|---|---|
| 9,912,295 | B1 * | 3/2018 | Miao | ........................ H03F 3/195 |
| 10,128,399 | B1 * | 11/2018 | Yap | ........................ H01L 31/02366 |
| 10,594,396 | B1 * | 3/2020 | Xia | ........................ G01J 1/0266 |
| 2013/0259483 | A1 * | 10/2013 | McLaren | ............ H04J 14/0305 |
| | | | | 398/79 |

| | | | | |
|---|---|---|---|---|
| 2013/0334434 | A1 * | 12/2013 | Nyman | ..................... G01J 1/44 |
| | | | | 250/371 |
| 2013/0336665 | A1 | 12/2013 | Suzuki | |
| 2015/0295660 | A1 | 10/2015 | Suzuki | |
| 2016/0226595 | A1 | 8/2016 | Duthel et al. | |
| 2020/0112291 | A1 * | 4/2020 | Lee | ..................... H03F 3/45475 |

FOREIGN PATENT DOCUMENTS

| | | | | |
|---|---|---|---|---|
| CN | 102386967 A | * | 3/2012 | ............. H04B 10/50 |
| JP | 4472874 B2 | * | 6/2010 | ............... G01J 1/44 |
| JP | 2106025513 | | 2/2016 | |

OTHER PUBLICATIONS

Lambrecht et al., "A 106-GB/s PAM-4 Silicon Optical Receiver", IEEE Photonics Technology Letters, vol. 31, No. 7, Apr. 1, 2019 (4 pages).

(Continued)

*Primary Examiner* — Georgia Y Epps
*Assistant Examiner* — Don J Williams
(74) *Attorney, Agent, or Firm* — Patterson + Sheridan, LLP

(57) ABSTRACT

In part, in one aspect the disclosure relates to an optical transducer such as an optoelectronic transducer. In many embodiments, the optoelectronic transducer may include a semiconductor substrate; a first photodiode comprising a first anode and first cathode; and a second photodiode comprising a second anode and a second cathode, wherein the first photodiode and the second photodiode comprise one or more semiconductor structures or layers disposed on or in the semiconductor substrate, wherein the first anode and the first cathode are electrically coupled to and reverse biased by one or more transimpedance amplifiers; wherein the second anode and the second cathode are electrically coupled to and reverse biased by one or more transimpedance amplifiers.

18 Claims, 30 Drawing Sheets

(56) References Cited

OTHER PUBLICATIONS

Lambrecht et al., "56-GB/s Silicon Optical Receiver Using a Low-Noise Fully-Differential Transimpedance Amplifier in SiGe BiCMOS," Proc. 44th Eur. Conf. Opt. Commun., Sep. 2018, pp. 1-3.

Schaefer, Semjon et al.; "Coherent receiver design based on digital signal processing in optical high-speed Intersatellite links with M-phase-shift keying"; Optical Engineering; vol. 55(11); (2016); 13 pages.

* cited by examiner

PD-Reverse-Bias = RFPD$_{BIAS}$ - V$_{inCM1}$

PD-Reverse-Bias = V$_{inCM2}$ - V$_{inCM1}$

PD-Reverse-Bias = RFPD$_{BIAS}$ - V$_{inCM1}$     PD-Reverse-Bias = V$_{inCM2}$ - V$_{inCM1}$

SYSTEMS AND METHODS TO IMPROVE PHOTODIODE AMPLIFICATION OPERATION IN PHOTONIC RECEIVER

CROSS REFERENCE TO RELATED APPLICATIONS

This application claims priority to and the benefit of U.S. Provisional Patent Application No. 63/074,258 filed Sep. 3, 2020, the disclosure of which is herein incorporated by reference in its entirety.

FIELD

This disclosure relates generally to the field of photocurrent amplification.

BACKGROUND

Contemporary optical communications and other photonic systems make extensive use of photonic integrated circuits that are advantageously mass-produced in various configurations for various purposes.

SUMMARY

In part, in one aspect the disclosure relates to an optical transducer such as an optoelectronic transducer. In many embodiments, the optical transducer may include a semiconductor substrate; a first photodiode that includes a first anode and first cathode; and a second photodiode that includes a second anode and a second cathode, wherein the first photodiode and the second photodiode comprise one or more semiconductor structures or layers disposed on or in the semiconductor substrate, wherein the first anode and the first cathode are electrically coupled to and reverse biased by one or more transimpedance amplifiers; wherein the second anode and the second cathode are electrically coupled to and reverse biased by one or more transimpedance amplifiers.

In various embodiments, the optical transducer may further include one or more transimpedance amplifiers. In some embodiments, the one or more transimpedance amplifiers is four transimpedance amplifiers. In various embodiments, a first transimpedance amplifier of the four transimpedance amplifiers is electrically coupled to the first anode, wherein a second transimpedance amplifier of the four transimpedance amplifiers is electrically coupled to the first cathode. In some embodiments, electrical coupling may include any suitable electrical connection that supports current flow. In some embodiments, a third transimpedance amplifier of the four transimpedance amplifiers is electrically coupled to the second anode, wherein a fourth transimpedance amplifier of the four transimpedance amplifiers is electrically coupled to the second cathode.

In various embodiments, each of the transimpedance amplifiers is a single ended transimpedance amplifier. In some embodiments, the one or more transimpedance amplifiers is one four quadrant transimpedance amplifier that includes four electrical terminals, wherein the first anode and the first cathode are electrically coupled to two of the electrical terminals and the second anode and the second cathode are electrically coupled to other two electrical terminals. In many embodiments, the one or more transimpedance amplifiers is two transimpedance amplifiers. In some embodiments, each of the two transimpedance amplifiers is a differential transimpedance amplifier, wherein each differential transimpedance amplifier comprises two inputs, wherein there is a 180 degree phase offset between the two differential transimpedance amplifiers.

In various embodiments, the first input of one of the differential transimpedance amplifiers is electrically coupled to the first anode of the first photodiode, wherein the second input of one of the differential transimpedance amplifiers is electrically coupled to the second cathode of the second photodiode. In many embodiments, the optical transducer may further include a summing circuit in electrical communication with the one or more transimpedance amplifiers.

In various embodiments, the reverse biasing of the first photodiode by the one or more transimpedance amplifiers increases signal to noise ratio of the optical transducer by a value that ranges from about 0.5 dB to about 3 dB. In some embodiments, one or more electrical connections between the first photodiode and one or more transimpedance amplifiers are wirebonds. In various embodiments, one or more electrical connections between the first photodiode and one or more transimpedance amplifiers are conductive pillars, wherein the first photodiode and the one or more transimpedance amplifiers are in a flipchip configuration. In many embodiments, a capacitance of semiconductor substrate ranges from about 15 Femtofarads to about 30 Femtofarads. In various embodiments, the one or more transimpedance amplifiers is one four quadrant transimpedance amplifier, wherein the four quadrant transimpedance amplifier comprises one or more complementary metal-oxide-semiconductor inverter transimpedance amplifiers and one or more voltage to current converters.

In some embodiments, optical transducer may further include a photonic integrated circuit, the photonic integrated circuit includes the semiconductor substrate, the first photodiode, the second photodiode, and the one or more transimpedance amplifiers.

In some embodiments, the semiconductor substrate is silicon, silicon on insulator, silicon oxide or silicon nitride. In various embodiments, the semiconductor substrate is silicon, silicon on insulator, silicon oxide or silicon nitride. In various embodiments, the optical transducer may further include a high pass filter in electrical communication with the first photodiode and the second photodiode. In many various embodiments, the one or more transimpedance amplifiers is an even number of transimpedance amplifiers, wherein electrical connections to terminals of each transimpedance amplifier an electrical components to which each connects are symmetric.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, PIC coatings/layers, optical paths, transimpedance amplifiers, photodiodes, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

Figure 1:
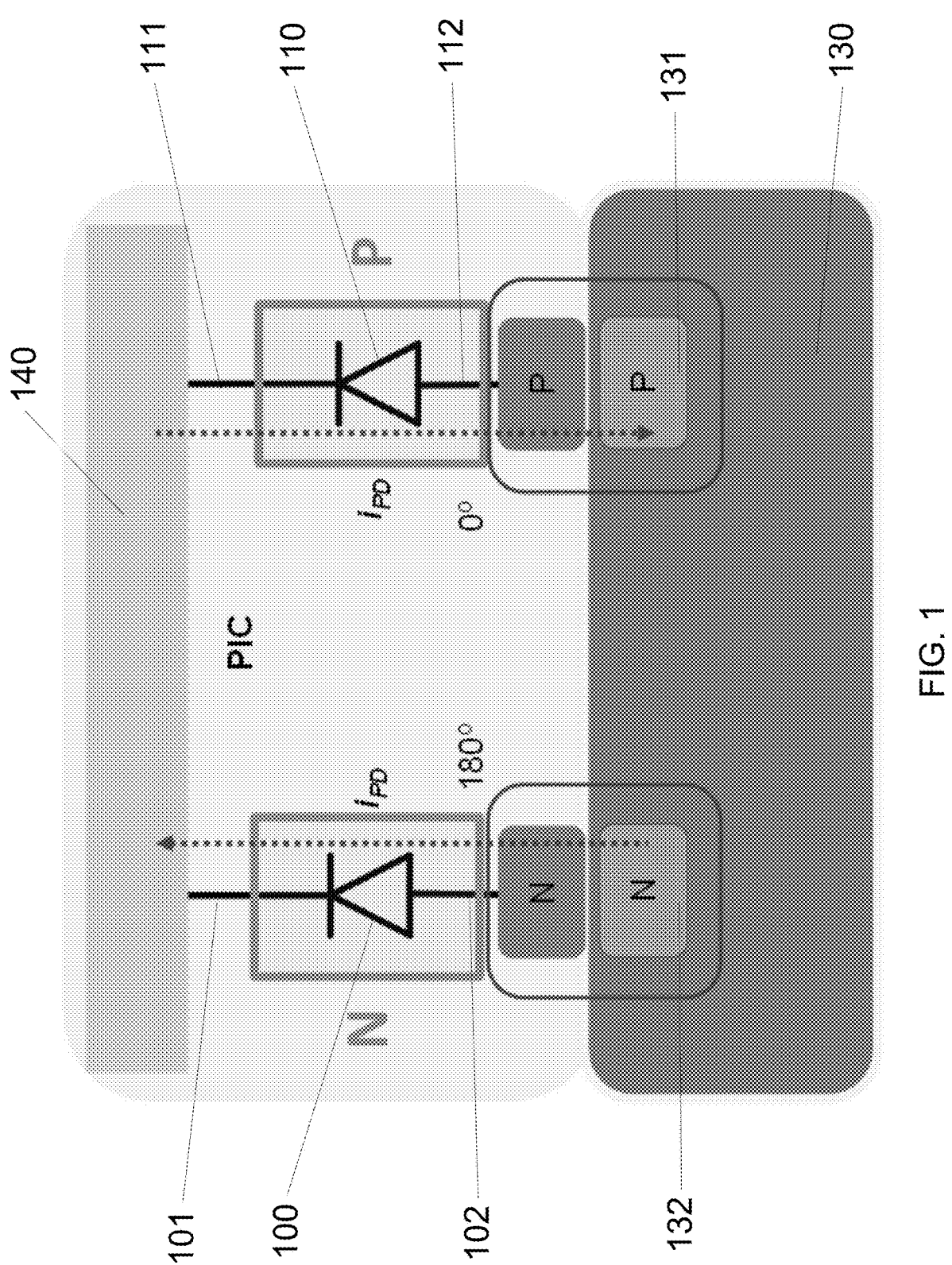
FIG. 1 is a diagram that depicts an exemplary embodiment of the current disclosure wherein two photodiodes integrated in a photonic integrated circuit (PIC) are configured to have their cathodes held at a fixed voltage by an external power source while current from their anodes is amplified by a differential transimpedance amplifier (TIA); the diodes are connected to the TIA such that currents may be 180 degrees out of phase with respect to one another.

In part the disclosure relates to various embodiments that improve the signal to noise ratio of optoelectronic transducers such as those used in optical telecommunication receivers and other devices. Further, various embodiments, use a first and a second optical receiver devices, such as a photodiode, and enhances the amplification of one or more signals generated thereby through modifications to maintaining a reverse bias for each such photodiode. Wasted power from an asymmetrical connection of one or more dedicated power supplies is avoided by substituting one or more transimpedance amplifiers (TIAs) and using them to provide power to maintain a reverse bias operating mode. In various embodiments, an RC time constant constraint is avoided that is associated with using one or more power supplies to reverse bias a given photodiode in an optical receiver or other device. Additional filtering and the associated losses and increase in noise in various embodiments is avoided by using one or more terminals of a TIA to electrical couple to one or more terminals of a photodiode in many embodiments. The connections and arrangement of TIAs and photodiodes is symmetric in various embodiments. The use of pairs of photodiodes and one or more TIAs, such as 1, 2, 4, 6, 8 or more TIAs may be used. In some embodiments, an odd number of TIAs are used. In many embodiments, one TIA or an even number of TIAs are used. All of the TIAs and photodiodes depicted and referenced herein may be identified as first, second, third, etc., without limitation and without being constrained to a particular embodiment, but rather for the purposes of disclosing and claim any combination or configuration of embodiments disclosed herein.

In some embodiments, a photosensitive diode/photodiode (PD) is operated in the reverse bias regime. Current generated by the PD is amplified prior to further processing such as extracting data therein. In standard integrated configurations, a DC bias is applied at one terminal of the PD to maintain the PD in reverse bias, while the other terminal of the PD is connected to a transimpedance amplifier. In various embodiments, a TIA amplifies a current. Some TIA's may convert a current to a voltage or be in communication with a current to voltage converter. However, some current is wasted (not amplified) over decoupling capacitors that sit between the PD's biased terminal and ground. In some configurations, decoupling capacitors provide an AC ground at the PD's biased terminal.

Applicant has determined that it is possible to remove the external bias and decoupling capacitors and enhance signal to noise ratio (SNR) and other advantages in optoelectronic transducer design. Instead, as part of an amplification or signal receiving device each terminal of the PD may connect to a terminal of a TIA. However, the TIAs are designed to maintain the same DC bias voltage across the PD such that the PD remains in reverse bias. In some embodiments, current amplification may be achieved along with an increase in SNR while both terminals of the PD are held at reverse biased voltages such as DC voltages such that the diode remains in reverse bias. While in reverse bias from TIA supplied power, current from both terminals is amplified with separate amplifiers, such as TIAs, as a multicomponent device, or preferably a single, integrated device.

Further, a PIC that includes one or more amplification devices, such as one or more TIAs, operating with two PDs, wherein amplified signals are added in-phase has further advantages. One advantage is that signals may be amplified while the noise components are not amplified. For example, a nominal amplification of about 3 dB of each signal PD becomes 6 dB for the sum, but uncorrelated noise from the sum of both channels remains at 3 dB amplification. In some embodiments the improvement in SNR may represent about a 50% increase, about a 100% increase, or higher. In some embodiments, the SNR increase may be about 1.5 dB. These improvements may be seen in various arrangements of PD pairs and various TIAs, such as 1, 2, 4 or more TIAs. Many of the optoelectronic transducers and other embodiments disclosed herein may be combined in arrays of multiple optoelectronic transducers and other devices.

A PD may be generally modeled as a capacitance in parallel with a current source. Equivalent capacitance seen by the amplifier can now be doubled in a traditional non-semiconductor electronic device. This is significant because the bandwidth of the device is proportional to a capacitive time constant which varies with the equivalent capacitance. However, as the equivalent capacitance is already quite small for silicon photonics, i.e. from about 15 to about 30 fF compared with about 500 fF in other technologies, doubling of this small capacitance does not create additional design challenges and is insignificant for devices with bandwidth less than about 40 GHz . . .

Both terminals of two PDs may be amplified with four single-ended TIAs (SETIAs), one PD terminal per SETIA. An SETIA may be implemented as a shunt-series TIA. Both terminals of two PDs may be amplified with TIAs, which may include two differential TIAs (DTIAs), where each terminal of a PD is connected to a different DTIA. A DTIA may be a configuration of two SETIAs. Both terminals of two PDs may be amplified with a single four quadrant TIA (4QTIA). A 4QTIA may be a configuration of two DTIAs. In various embodiments, as depicted, described and otherwise disclosed herein may be electrically coupled/connected in a symmetric configuration. For example, one TIA connected to one terminal of PD and the same or another TIA connected to the other terminal of PD can be present in a symmetrical configuration or arrangement. A PD that is connected to a power supply at one terminal and a TIA at the other terminal would not be symmetric.

A PD array may generally be on a different die from the TIA array. The two can be connected via either wire-bonding (which may create unwanted inductances) or flip-chip bonding. Refer now to the example embodiment of FIG. 1. Only one terminal (102 or 112) of a photosensitive diode (100 or 110) may be connected to a TIA (130), the other terminal (101 or 111) of the diode may be connected to an external bias (140) that may include coupling capacitors, and so current emitted from the diode that flows over the capacitors, which might otherwise be used to improve signal-to-noise ratio (SNR) for downstream information processing stages, may be wasted. The TIA 130 may have connection terminals 131 or 132 for connecting to the photodiodes 100, 101.

Figure 2:
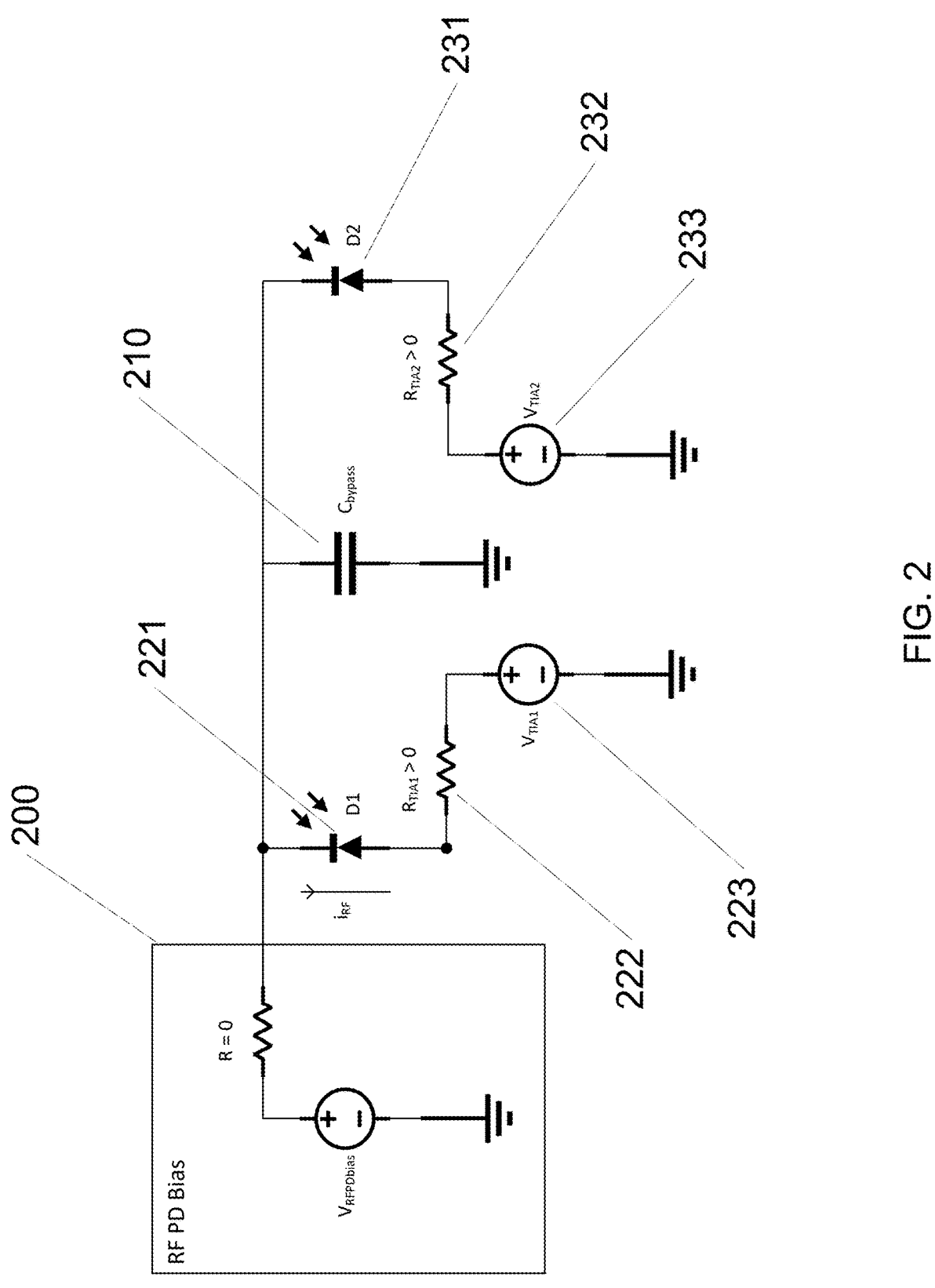
FIG. 2 is a diagram that depicts an exemplary embodiment of the current disclosure wherein the external biasing source of FIG. 1 is replaced with a Thevenin equivalent (a voltage source and series resistance) as well as a lumped bypass capacitor element and wherein the two terminals of the TIA are replaced by Thevenin equivalent circuits.

Refer now to the exemplary embodiment of FIG. 2, wherein the biasing voltage source and the TIA are represented by Thevenin equivalent circuits. The biasing voltage source is modeled as an ideal power supply (200), i.e. a voltage source with zero series resistance. The TIA, however, can be modeled as an imperfect power supply with some non-zero series resistance (222 or 232), as any amplifier has some non-zero input impedance. Some current will flow over a bypass capacitor $C_{bypass}$ (210) and be lost, some current will be amplified by the TIA. A first photodiode 221 and a second photodiode 231 are shown in electrical with voltage sources 223 and 233.

Figure 3:
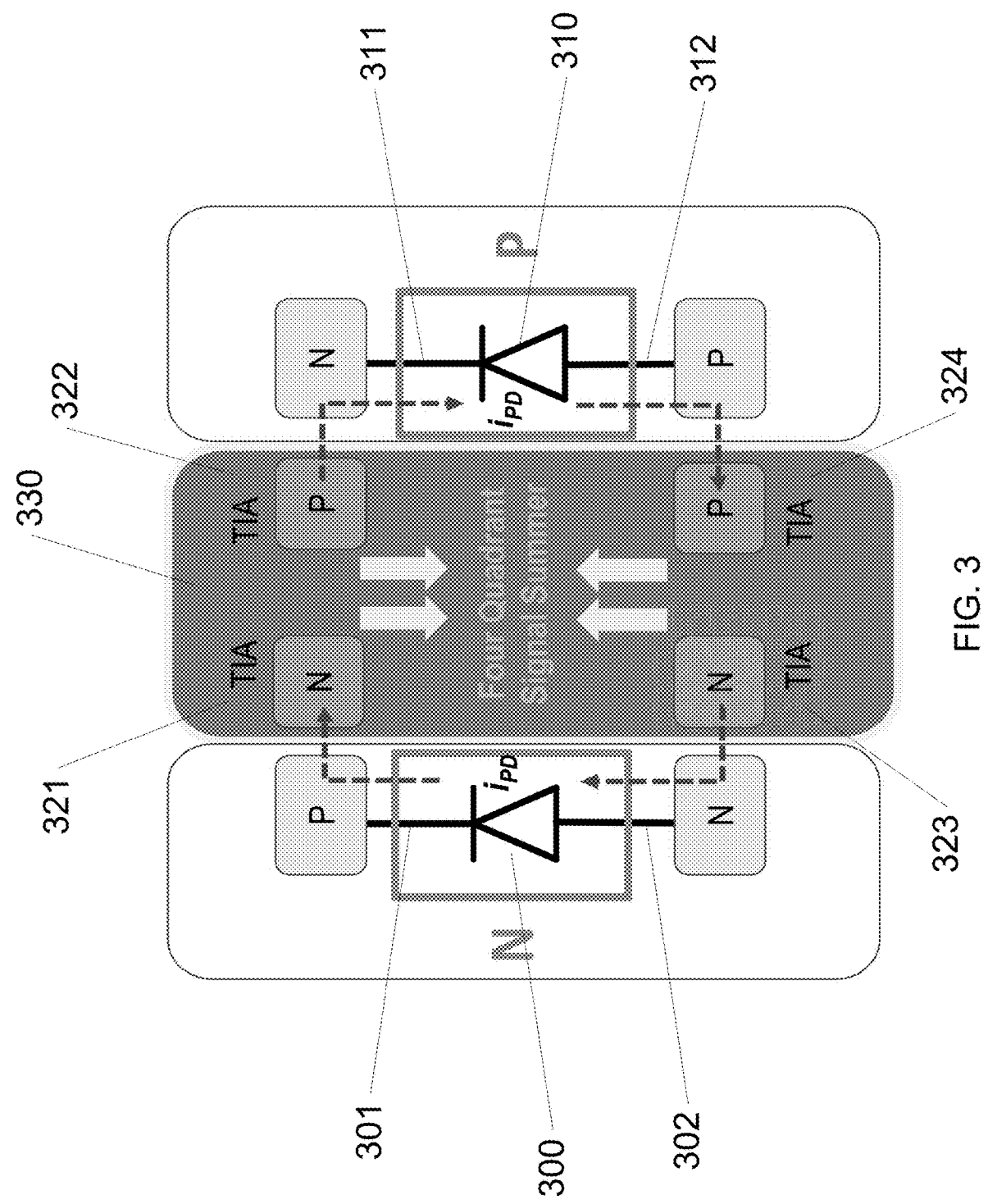
FIG. 3 is a diagram that depicts an exemplary embodiment of the current disclosure wherein two photodiodes are configured to have current from each terminal (cathode and anode) amplified by a TIA and wherein the outputs of each of the four TIAs are summed by a four quadrant signal summer.

Refer now to the exemplary embodiment of FIG. 3 wherein, both terminals (301 and 302 or 311 and 312) of each of two PDs (300 and 310) may be connected to transimpedance amplifiers (TIAs, 321, 322, 323, and 324) in a manner that provides further signal amplification. In various embodiments, the selective connection of photodiode terminals may increase SNR. In some embodiments, the SNR may be increased by value that ranges from about 0.5 dB to about 1 dB. In many embodiments, the SNR may be increased by value that ranges from about 0.5 to about 3. In some embodiments, the SNR may be increased by value that ranges from about 1 dB to about 3 dB. The combination of components of FIG. 3 may operate together as four quadrant signal summer and be fabricated as a semiconductor TIA device 330.

Figure 4:
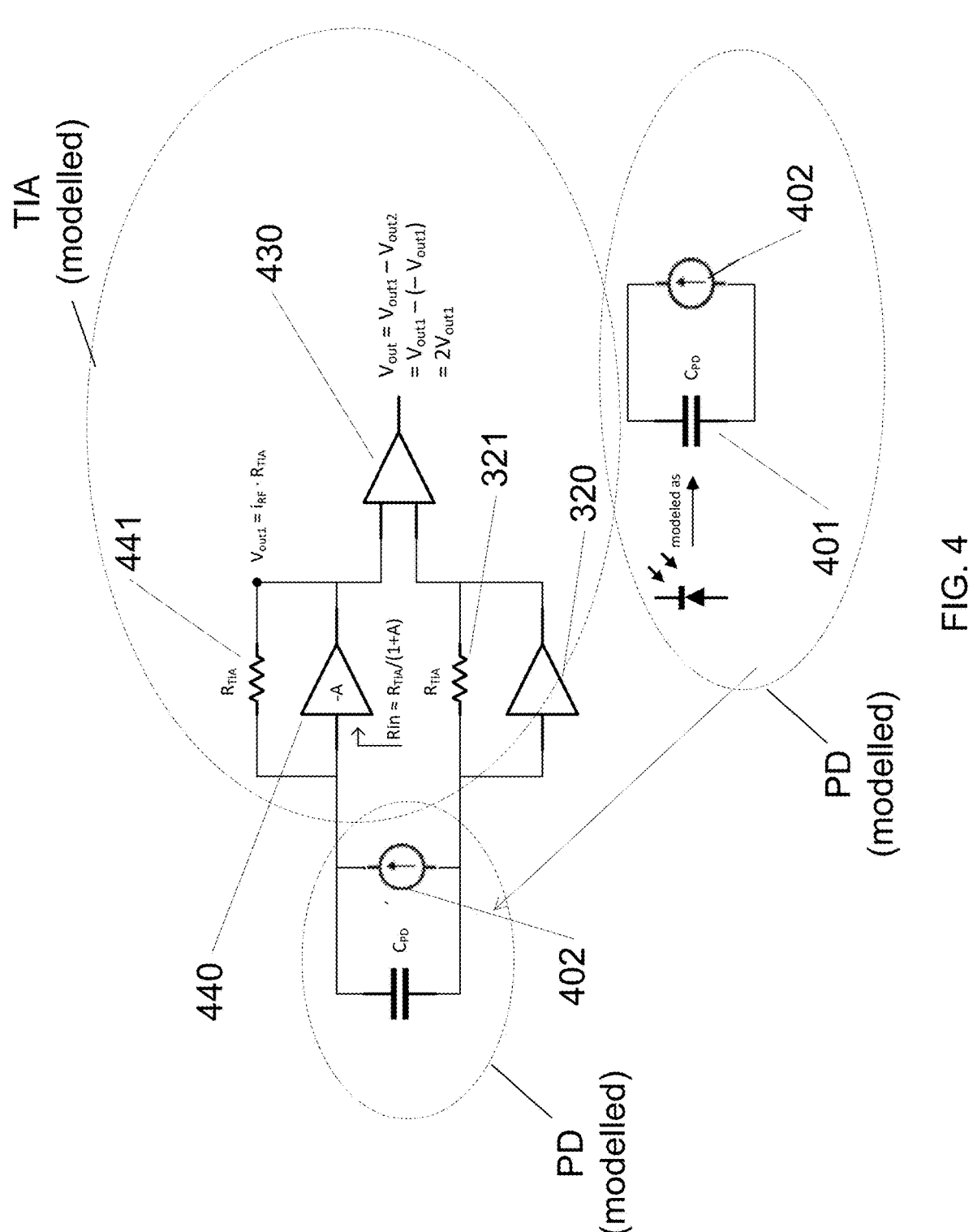
FIG. 4 is a diagram that depicts an exemplary embodiment of the current disclosure through a generalized circuit model.

Refer now to the exemplary embodiment of FIG. 4, wherein a PD is modeled as a capacitance (401) in parallel with a current source (402). FIG. 4 is depicts an exemplary embodiment of the current disclosure wherein a single photodiode expanded into a Norton equivalent representation shown as a current source 402 in parallel with an impedance (capacitance) 401 is configured to have current from each terminal amplified by a separate TIA expanded into a single input amplifier with a feedback resistance 441. The modelled TIA includes two resistors 441, 321 and the amplifiers 440, 320, 430. The modelled PD corresponds to the PD that would be reverse biased by the TIA.

A potential disadvantage is that the equivalent capacitance seen by the amplifier is now doubled. This is significant because the bandwidth of the device is proportional to a capacitive time constant which varies with the equivalent capacitance. However, as the equivalent capacitance is already quite small for silicon photonics, i.e. from about 15 to about 30 fF compared with about 500 fF in other technologies, doubling of this small capacitance does not create additional design challenges and is expected to be insignificant for devices with bandwidth less than 50 GHz.

Figure 5:
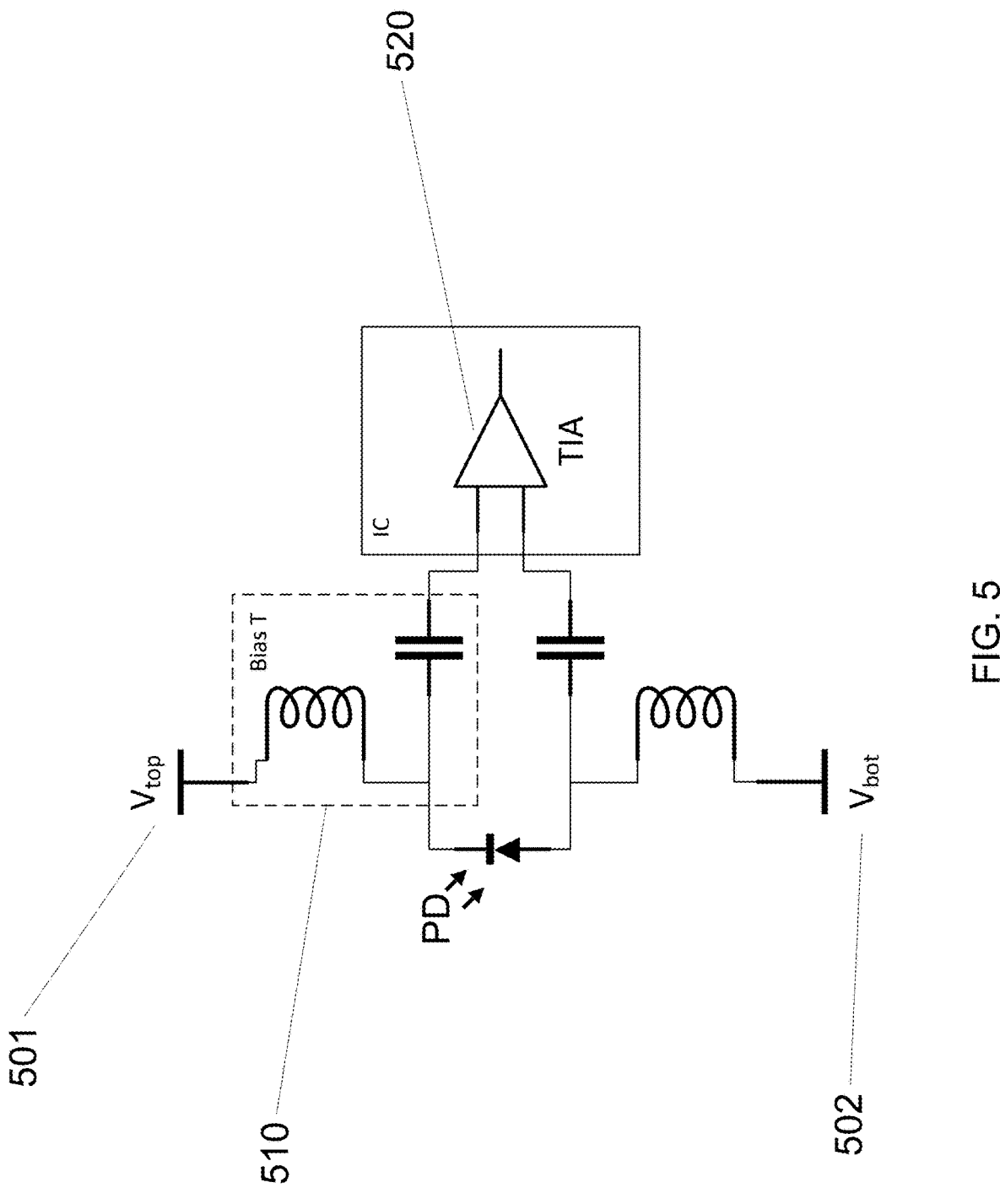
FIG. 5 is a diagram that depicts an exemplary embodiment of the current disclosure wherein amplifying current from both terminals of a PD may include a "bias T" element including but not limited to a shunt inductance and series capacitance at each terminal of the PD to hold the PD in reverse bias.

In some embodiments, designs may have AC-coupling and biasing networks that permit the biasing of the PD across the inputs of a differential amplifier; however, these solutions are impractical for highly integrated applications such as RF communications devices using photodiode arrays. For example, the embodiment depicted in FIG. 5 uses a Bias-T (510) at each terminal of a diode to allow current from each terminal to be amplified by a TIA (520).

Figure 6:
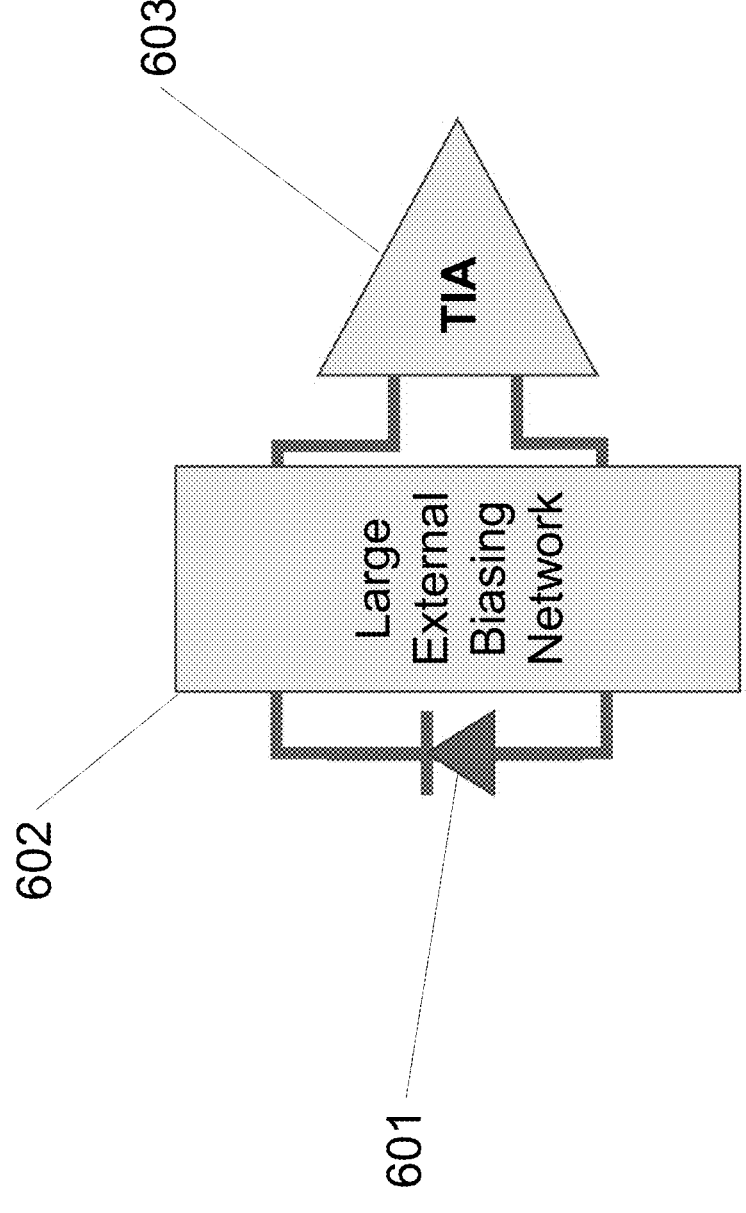
FIG. 6 is a diagram that depicts an exemplary embodiment of the current disclosure depicting a TIA connected to a biasing network that in turn reverse bias a photodiode.

In turn, FIG. 6 shows amplifying current from both terminals of a PD may include a large biasing network placed between the PD and a TIA to hold the PD in reverse bias. Each Bias-T has a respective top voltage 501 and a bottom voltage 502.

The embodiment depicted in FIG. 6 uses a large external biasing network (602) to ensure the PD 601 is reverse-biased for high-speed RF communication applications. In various preferred embodiments, this approach is avoided and semiconductor-based TIAs are used in lieu of network 602. In many embodiments, the current disclosure may use TIAs with different common-mode voltages to bias PDs without external components. One or more TIAs 603 may also couple to biasing elements that in turn couple to one or more PD terminals.

Figure 7A:
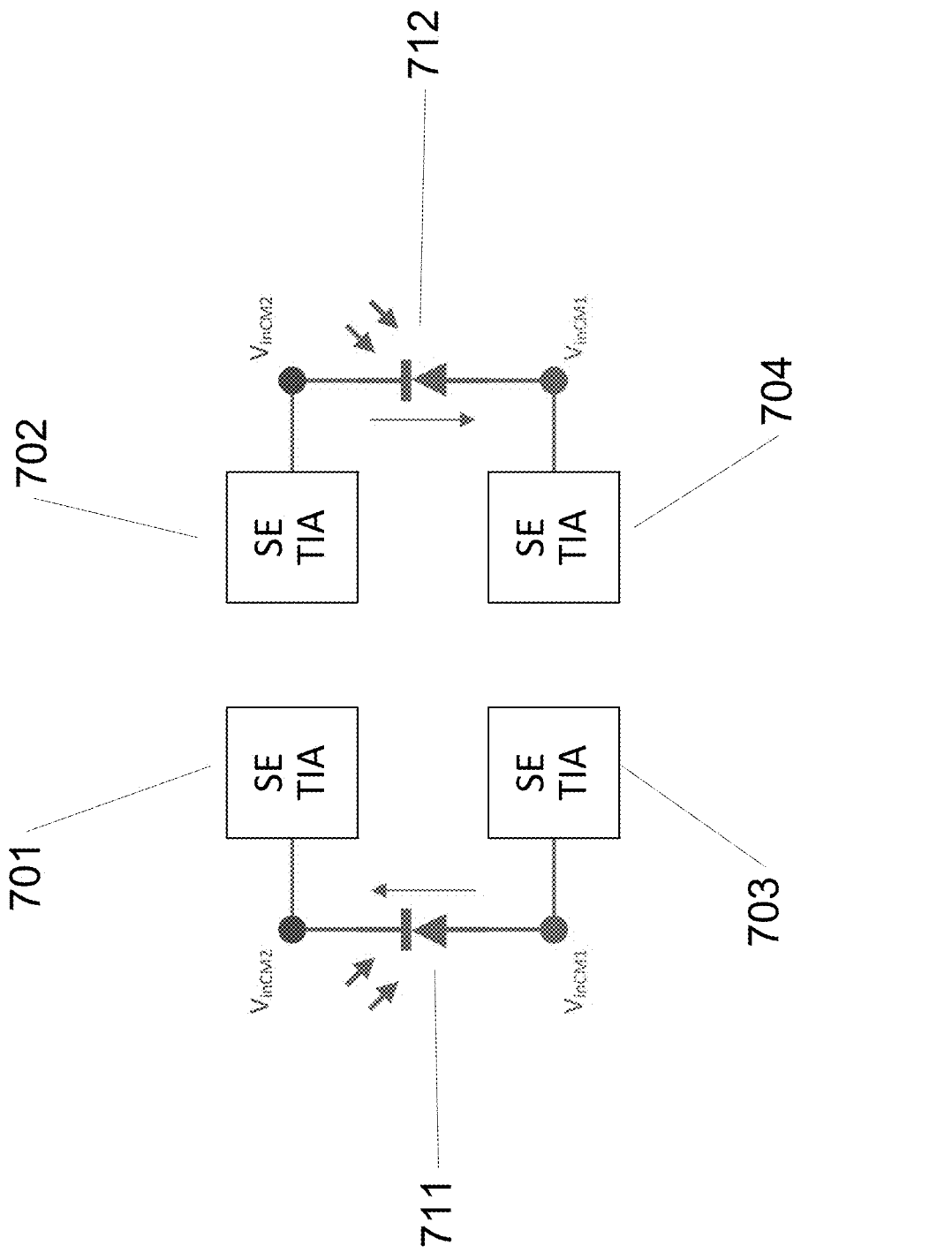
FIG. 7A is a diagram that depicts an exemplary embodiment of the current disclosure wherein each terminal of two matched PDs is amplified by a separate single-ended transimpedance amplifier (SETIA) and wherein the SETIAs hold each of the two PD cathodes at a voltage $V_{inCM2}$ and each of the PD anodes at a voltage $V_{inCM1}$ such that the PDs are maintained in a reverse bias regime.
Figure 7B:
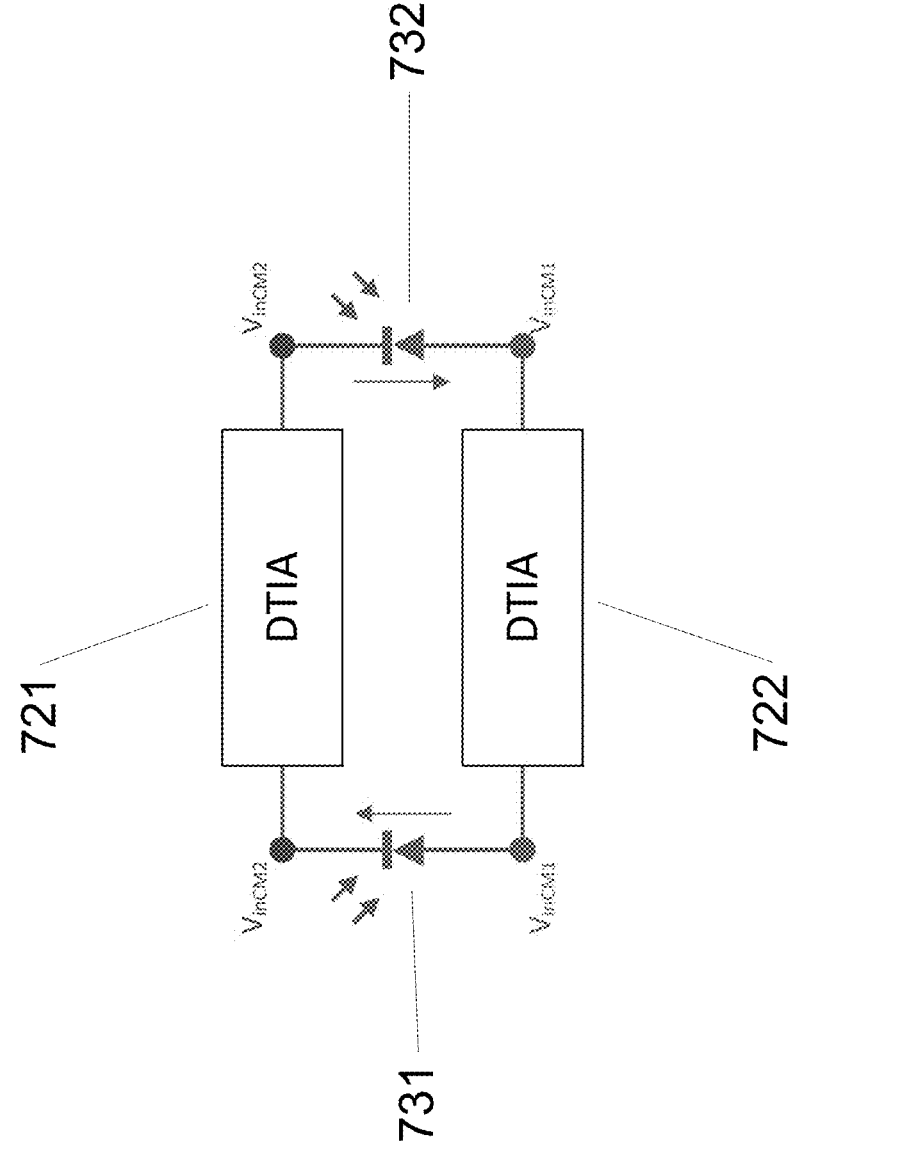
FIG. 7B is a diagram that depicts an exemplary embodiment of the current disclosure wherein each terminal of two matched PDs is amplified by a pair of differential transimpedance amplifiers (DTIA) and wherein the DTIAs hold each of the two PD cathodes at a voltage $V_{inCM2}$ and each of the PD anodes at a voltage $V_{inCM1}$ such that the PDs are maintained in a reverse bias regime.
Figure 7C:
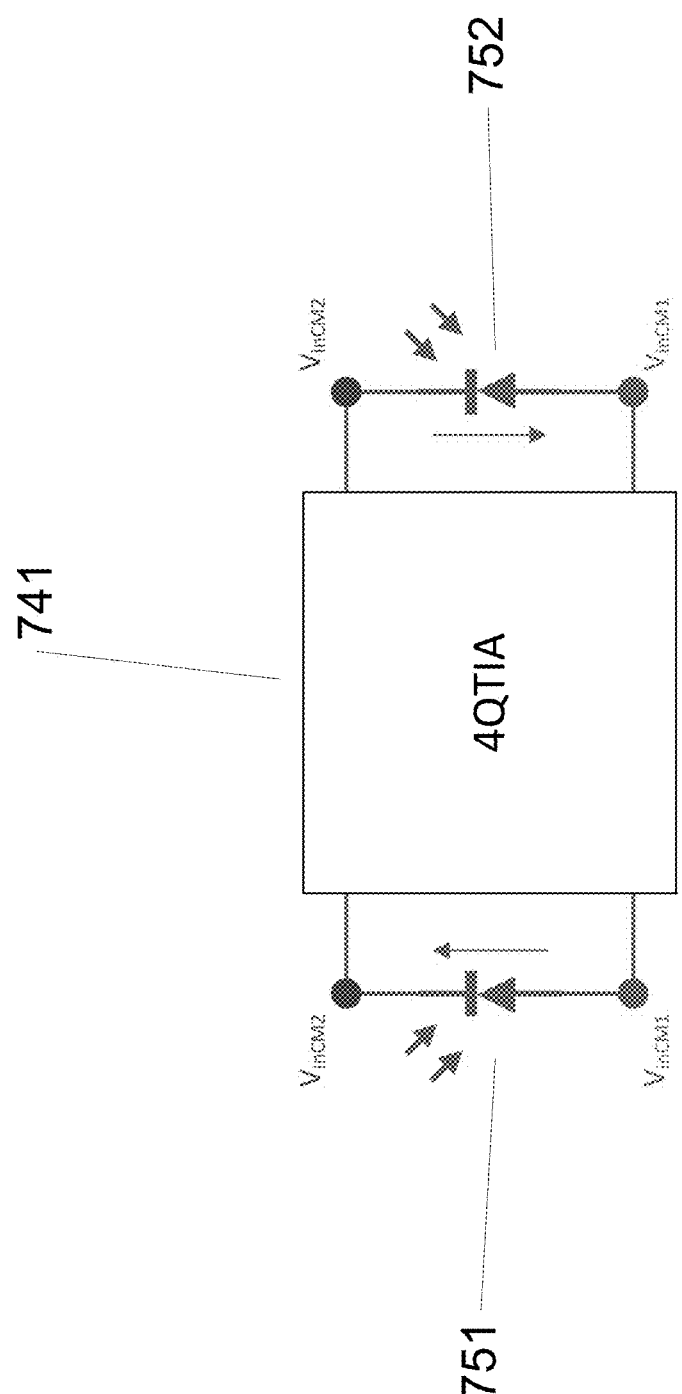
FIG. 7C is a diagram that depicts an exemplary embodiment of the current disclosure wherein each terminal of two matched PDs is amplified by a single four-quadrant transimpedance amplifier (4QTIA) and wherein the 4QTIA holds each of the two PD cathodes at a voltage $V_{inCM2}$ and each of the PD anodes at a voltage $V_{inCM1}$ such that the PDs are maintained in a reverse bias regime.

Various embodiments may use different TIA configurations. In some embodiments, for example the embodiment of FIG. 7A, each terminal of two PDs 711, 712 may be connected to a separate single-ended TIA (SETIA, 701, 702, 703, and 704) for a total of four SETIAs. In some embodiments, for example the embodiment of FIG. 7B, each terminal of the first of two PDs 731, 732 may be connected to a different differential TIA (DTIA, 721 and 722) and each terminal of the second of two PDs may be connected to the opposite (unused) input of the DTIAs. In most embodiments, a DTIA may have two inputs with a 180 degree phase offset between them. In most embodiments, a DTIA may be a particular configuration of two SETIAs. In some embodiments, for example the embodiment of FIG. 7C, each terminal of two PDs may be connected to one of four inputs to a single four quadrant TIA (4QTIA, 741). FIG. 7C depicts two PDS 751, 52 wherein each terminal of the two PDs 751, 752 is amplified by a single four-quadrant transimpedance amplifier (4QTIA) 741 and wherein the 4QTIA holds each of the two PD cathodes at a voltage $V_{inCM2}$ and each of the PD anodes at a voltage $V_{inCM1}$ such that the PDs are maintained in a reverse bias regime. In many embodiments, a 4QTIA may be a configuration of two DTIAs.

In most embodiments, the TIAs, whether SETIAs, DTIAs, or a 4QTIA, may set the bias points at both terminals of both PDs. In most embodiments, the TIA-based biasing may be equivalent to traditional external biasing configurations. In most embodiments, the cathode of a PD is connected to the TIA terminal providing a higher common-mode voltage, and the anode of the PD to the TIA providing a lower common-mode voltage, such that the PD remains in reverse bias.

Figure 8:
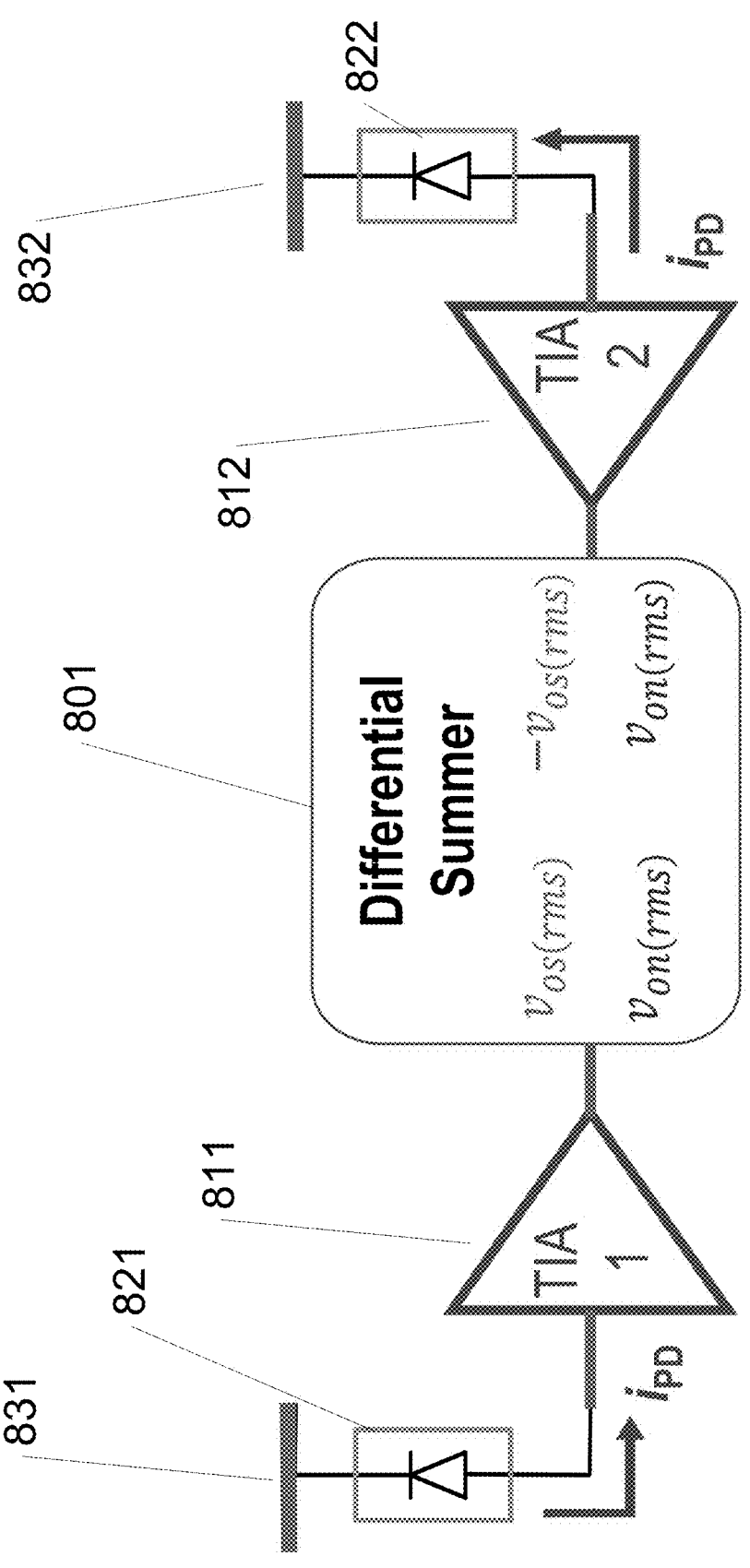
FIG. 8 is a diagram that depicts an exemplary embodiment of the current disclosure configured to amplify only the anode terminals of two PDs with a separate SETIA and wherein the SETIA outputs, consisting of an output voltage $v_{os(rms)}$ carrying a signal of interest in linear combination with a noise voltage $v_{on(rms)}$, are summed by a differential summer.

In certain embodiments, the output signals from each of four SETIAs may be summed; in certain embodiments, the two output signals from each of two DTIAs may be summed; in certain embodiments, the four output signals from a 4QTIA may be summed. In some embodiments, the summation of outputs may be a summation of voltages or of currents. In FIG. 8, photodiodes 821, 822 may connect to other electrical elements 831, 832 such as another respective TIA to reverse bias the photodiode. In some embodiments, electrical elements 831, 832 are bias connection points for a given photodiode and may be TIAs or voltage sources/supply voltages.

In some embodiments, the correlation between two signals may affect the root-mean-square (RMS) value of their sum. For example, two signals $v_{n1(t)}$ and $v_{n2(t)}$ are combined together as $v_{no(t)}=v_{n1(t)}+v_{n2(t)}$, and where $v_{n1(t)}$, $v_{n2(t)}$, and $v_{no(t)}$ have RMS values $V_{n1(rms)}$, $V_{n2(rms)}$, and $V_{no(rms)}$, respectfully, then $$V_{no(rms)}^2 = \frac{1}{T}\int_0^T [v_{n1}(t) + v_{n2}(t)]^2 dt$$

$$= v_{n1}(t) + v_{n2}(t) + \frac{2}{T}\int_0^T [v_{n1}(t)\cdot v_{n2}(t)]^2 dt$$

$$= V_{n1(rms)}^2 + V_{n2(rms)}^2 + 2CV_{n1(rms)}V_{n2(rms)}$$

where C is the correlation coefficient $$C \equiv \frac{\frac{1}{T}\int_0^T v_{n1}(t)v_{n2}(t)dt}{V_{n1(rms)}V_{n2(rms)}}.$$

Refer now to the embodiment of FIG. 8, wherein the anodes of matched PDs (821 and 822) source or sink a current of $i_{PD}$ that is amplified by a DTIA, the TIA output signals are equal with opposite polarity ($+v_{os(rms)}$ and $-v_{os(rms)}$), the correlation coefficient C is equal to 1, and the differential output power is $$V_{osDTIA(rms)}^2=(+v_{os(rms)})^2+(-v_{os(rms)})^2+2C(+v_{os(rms)})(-v_{os(rms)})$$

$$V_{osDTIA(rms)}=2v_{os(rms)}.$$

Noise from the two TIAs 811, 812 is uncorrelated (C=0), and the differential noise power is $$V_{osDTIA(rms)}^2=(+v_{on(rms)})^2+(-v_{on(rms)})^2+2C(+v_{on(rms)})(-v_{on(rms)})$$

$$V_{osDTIA(rms)}=\sqrt{2}v_{on(rms)}.$$

The SNR of this configuration is $$SNR_{DTIA} = \frac{2v_{os(rms)}}{\sqrt{2}\,v_{on(rms)}} = \sqrt{2}\,\frac{v_{os(rms)}}{v_{on(rms)}}.$$

As shown in FIG. 8, the amplified signals from each TIA are combined using a differential summer 801.

Figure 9A:
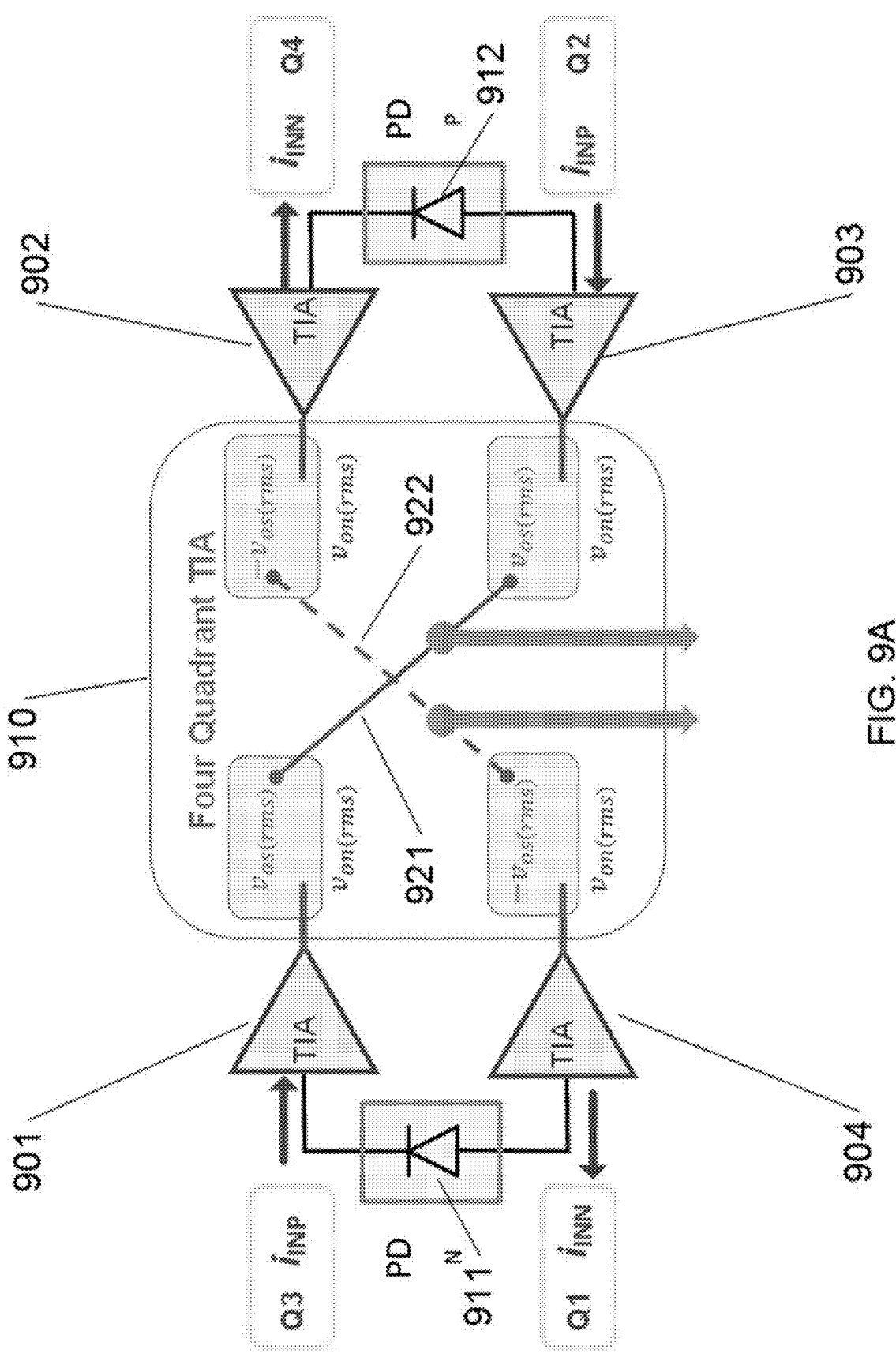
FIG. 9A is a diagram that depicts an exemplary embodiment of the current disclosure wherein current from both the cathode and anode of each of two matched PDs is amplified by a 4QTIA and summed such that the signal components of the output voltages of each quadrant are summed to produce a differential pair that rejects common mode corruptions such as power supply variation.

Refer now to the example embodiment of FIG. 9A, wherein a 4QTIA 910 configured to amplify current from both terminals of two PDs 911, 912, and wherein the 4QTIA 910 may hold or maintain the cathode of a PD "$PD_N$" (911) at a voltage $V_{in(CM2)}$, the anode of $PD_N$ at a voltage $V_{in(CM1)}$, the cathode of a PD "$PD_P$" (912) at a voltage $V_{in(CM2)}$, and the anode of $PD_P$ at voltage $V_{in(CM1)}$. The difference in voltage between the two terminals of each PD, i.e. $V_{in(CM2)}-V_{in(CM1)}$, may hold or maintain each PD in reverse bias conditions necessary for high-speed RF operation. In the example embodiment, a current $-i_{PD}$ may be sunk or otherwise flow into the anode of $PD_N$ from a terminal of the 4QTIA and amplified to produce a first output voltage. This first output voltage may include a root-mean-squared (RMS) signal component $-v_{os(rms)}$ together with an RMS noise component $v_{on(rms)}$. In various embodiments, the noise component is a noise power. The various signal sums are shown by connections 921 and 922, respectively. Each quadrant, with each PD current is identified by Q1, Q2, Q3, and Q4.

In addition, still referring to FIG. 9A, a current $i_{PD}$ may be sourced from the cathode of $PD_N$ to a terminal of the 4QTIA and amplified to produce a second output voltage. This second output voltage may include an RMS signal component $v_{os(rms)}$ together with an RMS noise component $v_{on(rms)}$; a current $i_{PD}$ may be sourced from the anode of $PD_P$ into a terminal of the 4QTIA and amplified to produce a third output voltage. The third output voltage may include a RMS signal component $v_{os(rms)}$ together with an RMS noise $v_{on(rms)}$. A current $-i_{PD}$ may be sunk into the cathode of $PD_P$ from a terminal of the 4QTIA and amplified to produce a fourth output voltage. The fourth output voltage may include an RMS signal component $-v_{os(rms)}$ together with an RMS noise component $v_{on(rms)}$. These four output voltages, each composed of a signal component and a noise component, may be summed.

In some embodiments, such as the example embodiment of FIG. 9A two PDs in a configuration with a 4QTIA may enable a 6 dB amplification of PD signal and a 3 dB boost in SNR as compared with an embodiment wherein current from only one terminal of each PD is amplified, by means of, for example, a DTIA. Just as in an embodiment exemplifying a single DTIA, voltages generated from amplified currents sourced or sunk from the anodes of two matched PDs are equal in magnitude and opposite in sign ($+v_{os(rms)}$ and $-v_{os(rms)}$); likewise, voltages generated from amplified currents sourced or sunk from the cathodes of two matched PDs are equal in magnitude and opposite in sign ($-v_{os(rms)}$ and $+v_{os(rms)}$). When individual output voltages are summed in this configuration, the net mean-square output voltage is equal to $$v_{os4QTIA(rms)}^2=(+v_{os(rms)})^2+(-v_{os(rms)})^2+2C(+2v_{os(rms)})(-2v_{os(rms)})=16v_{os(rms)},$$

and thus, as C=1, $$v_{os4QTIA(rms)}^2=4v_{os(rms)},$$

or twice (6 dB) the signal component of the net RMS output voltage from a single DTIA configured with an external bias, wherein $v_{osDTIA(rms)}=2v_{os(rms)}$.

Figure 9B:
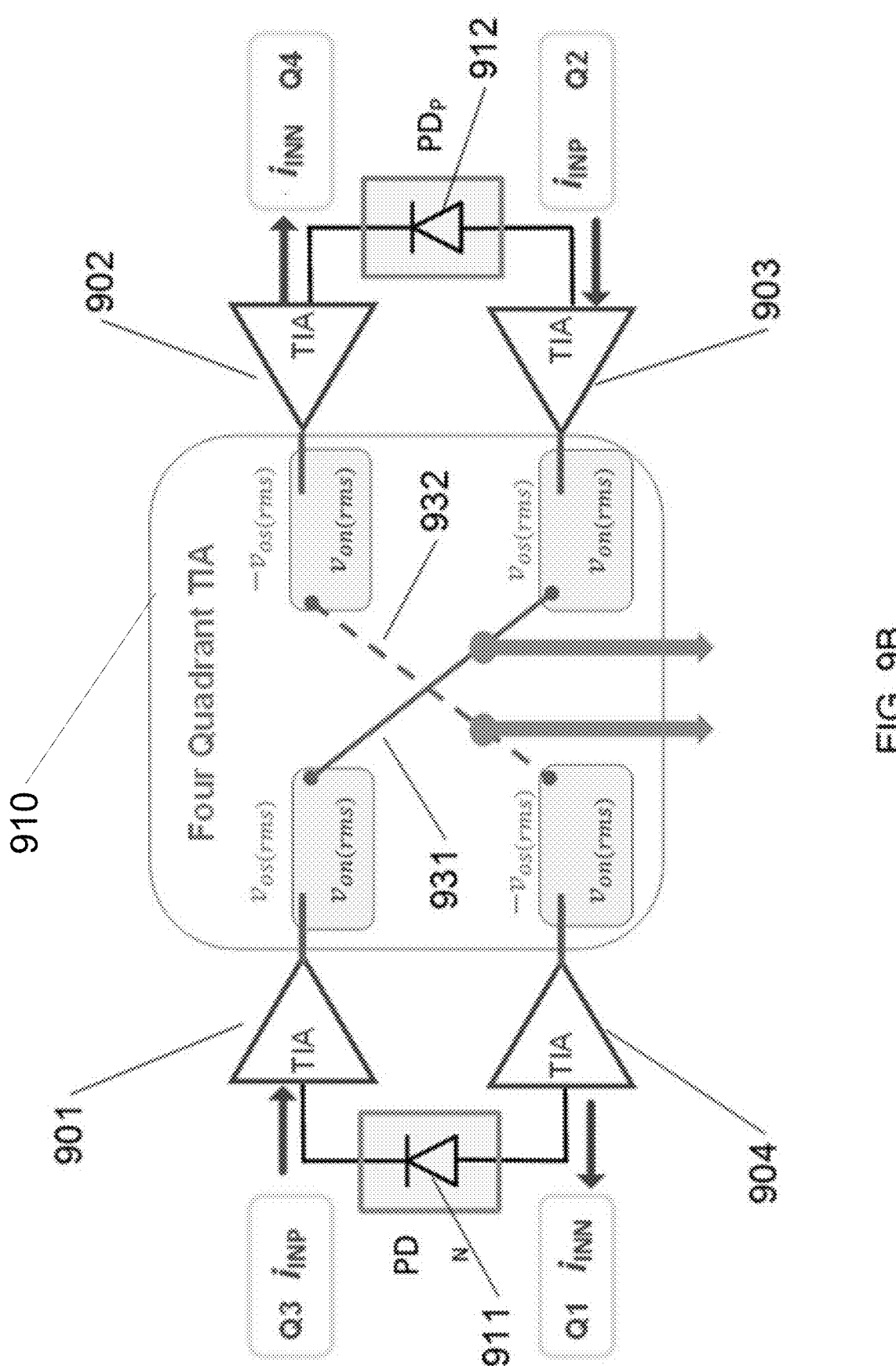
FIG. 9B is a diagram that depicts an exemplary embodiment of the current disclosure wherein two PDs are amplified in the same configuration of FIG. 9A and wherein the noise components of the output voltages of each quadrant of a 4QTIA are also summed into the differential pair.

Now referring to the embodiment of FIG. 9B a four quadrant TIA 910 is used. PDs 911 and 912 are electrically coupled by each of their terminals to TIAs 901, 902, 903, and 904 as shown. Various signals are combined as shown by connections 931 and 932 and as outlined below. In the embodiment of FIG. 9B, for example, the noise signals add, $$V_{on4QTIA(rms)}^2=(\sqrt{2}v_{on(rms)})^2+(\sqrt{2}v_{on(rms)})^2+2C(\sqrt{2}v_{on(rms)})(\sqrt{2}v_{on(rms)})=4v_{on(rms)}^2,$$

and thus, as C=0, $$V_{on4QTIA(rms)}^2=2v_{on(rms)},$$ which is greater by a factor of $\sqrt{2}$ as compared to the RMS voltage of the noise component from a single DTIA configured with an external bias, wherein $V_{onDTIA(rms)} = \sqrt{2} V_{on(rms)}$. Finally, the SNR of the 4QTIA configuration is thus $$SNR_{4QTIA} = \frac{4v_{os(rms)}}{2v_{on(rms)}}.$$

The net improvement in SNR over the single DTIA configuration is then $$\frac{SNR_{4QTIA}}{SNR_{DTIA}} = \frac{2}{2/\sqrt{2}} = \sqrt{2}$$

equivalent to an about 3 dB improvement in SNR.

Figure 10:
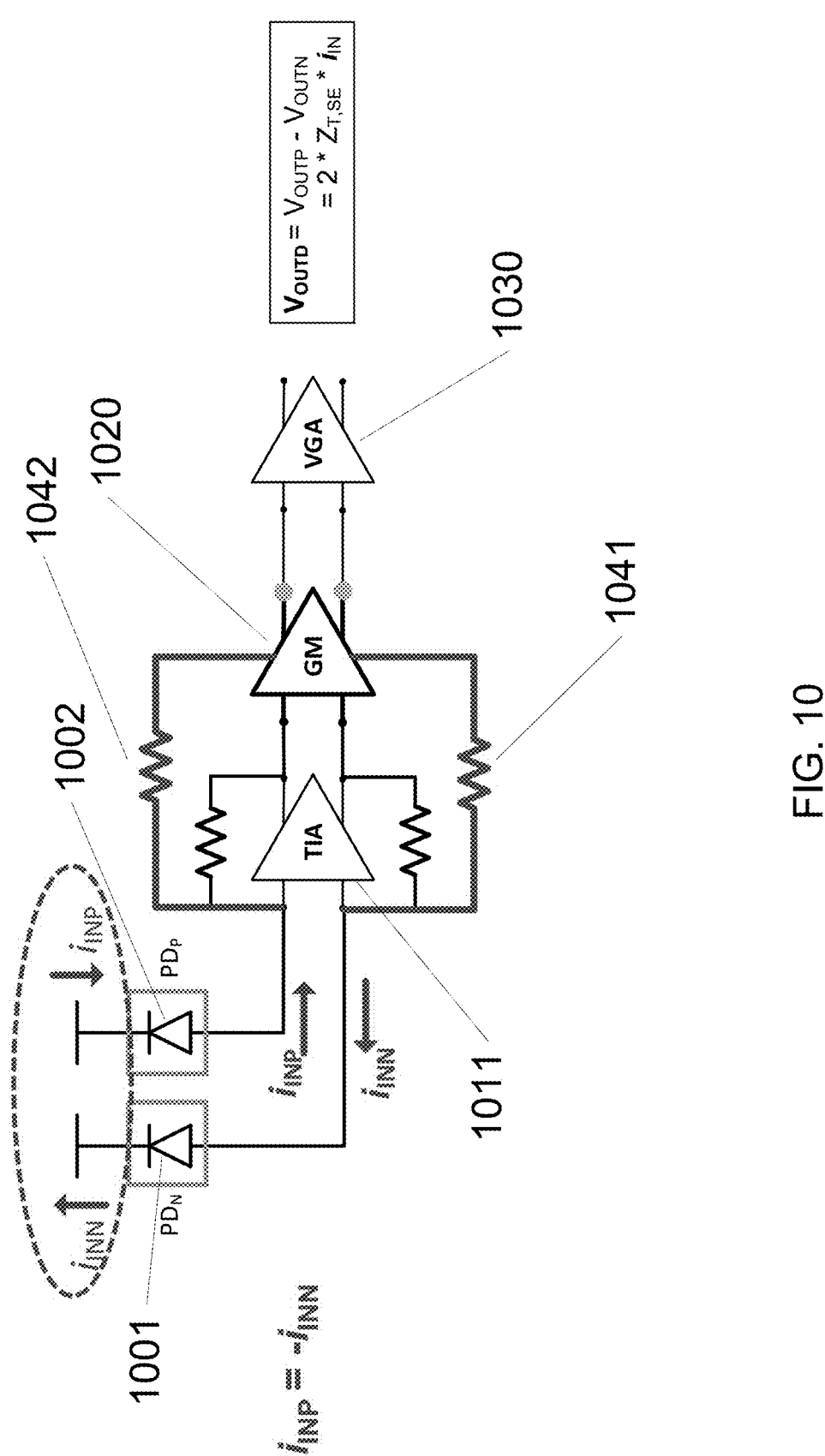
FIG. 10 is a diagram that depicts an exemplary embodiment of the current disclosure wherein current is amplified from the anodes of two PDs while the cathodes are held at a voltage sufficient to keep the PDs in reverse bias and wherein the amplifier may include a TIA followed by a $g_m$ transconductance stage, in turn followed by a variable gain amplifier (VGA).

Refer now to the example embodiment of FIG. 10, wherein two photodiodes $PD_N$ (1001) and $PD_P$ (1002) are each connected to a TIA (1011) with transimpedance $Z_{T,SE}$, wherein $PD_N$ sits across one input terminal of the TIA and a bias voltage and wherein $PD_P$ sits across the other input terminal of the TIA and a bias voltage, wherein $PD_N$ sources current $i_{INN}$ from the TIA into its anode and $PD_P$ sinks current $i_{INP}$ from its anode into the TIA, wherein $i_{INP} = -i_{INN}$, and wherein the differential output between the two outputs of the TIA is $$V_{OUTD} = V_{OUTP} - V_{OUTN}$$
$$= 2 \cdot Z_{T,SE} \cdot i_{INP}.$$

Current sourced or sunk from the cathodes of the PDs will flow across decoupling capacitors near the biasing power supply and so will not be amplified for use with downstream signal processing stages. In various embodiments of the current disclosure, both $V_{OUTP}$ and $V_{OUTN}$ are doubled by amplifying current from both terminals of each of the PDs, such that $$V_{OUTD} = 2V_{OUTP} - 2V_{OUTN}$$
$$= 4 \cdot Z_{T,SE} \cdot i_{INP}.$$

In FIG. 10, the TIA 1011 in electrical communication with the transconductance amplifier (GM) 1020 and the feedback resistors 1041, 1042 such that this combination is a shunt-series transimpedance amplifier. A variable gain amplifier (VGA) 1030 is also in electrical communication with the shunt-series TIA and is used in various receiver embodiments and configurations.

Figure 11A:
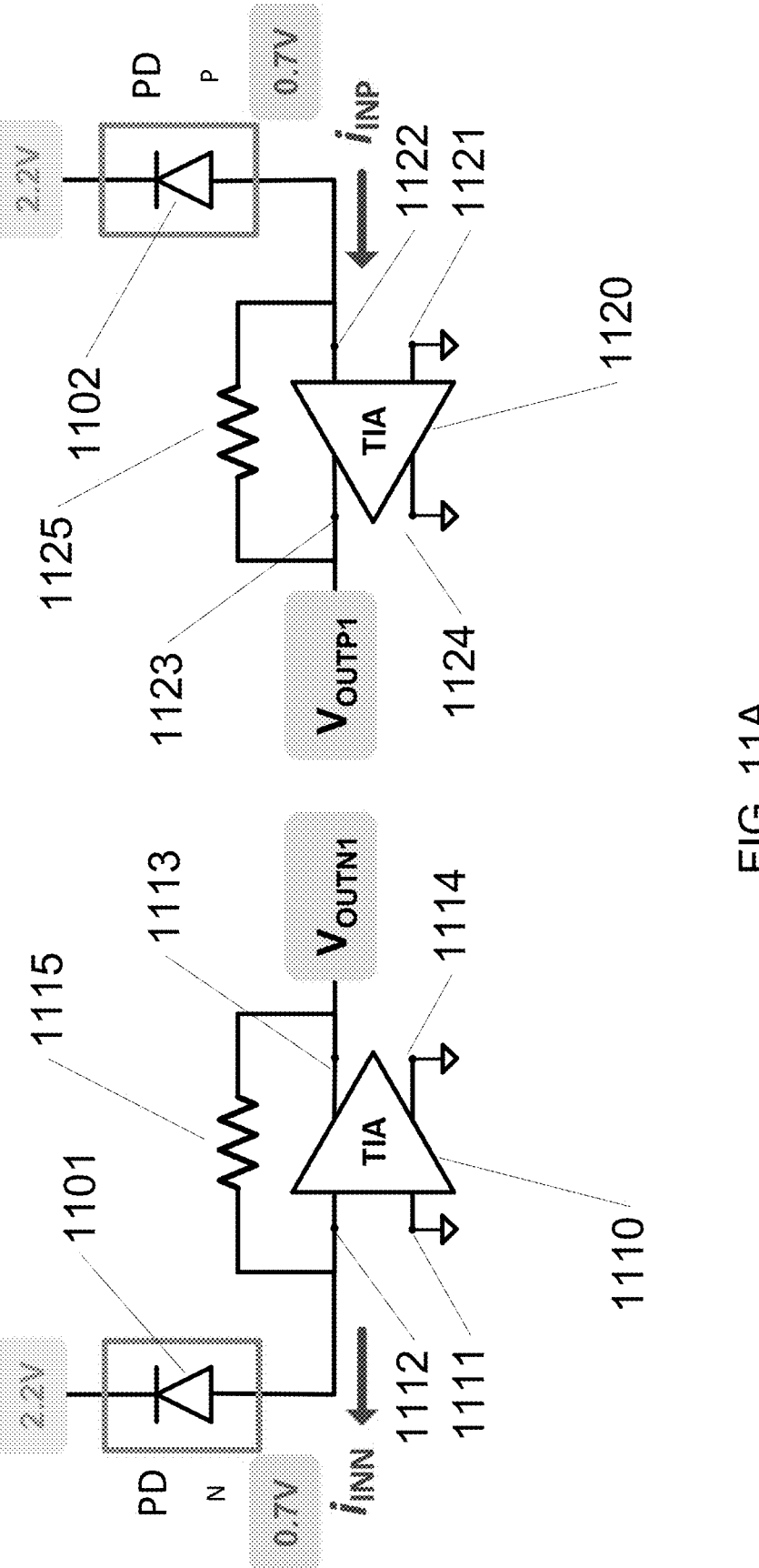
FIG. 11A is a diagram that depicts an exemplary embodiment of the current disclosure wherein two TIAs amplifying current from the anodes of two matched PDs form the lower half of a 4QTIA and wherein the TIAs are level shifted such that the PDs' anodes are held at a voltage appropriate for reverse bias.

In some embodiments, the bottom half of a 4QTIA may be equivalent to a single traditional DTIA. In the embodiment of FIG. 11A, for example, wherein the anode of a PD "$PD_N$" (1101) is connected to and draws current $i_{INN}$ from an input terminal (1112) of a TIA (1110), wherein the cathode of $PD_N$ is assumed to be held at a voltage, say 2.2 V, such that the voltage at the anode, say 0.7 V, as determined by the TIA is sufficient to keep the PD in reverse bias, wherein a feedback resistor (1115) is connected across the TIA, wherein the TIA input terminal (1111) and the TIA output terminal (1114) of the TIA that do not carry the signal from the PD are grounded. The active output terminal (1113) produces a voltage $V_{OUTN1}$, and wherein the anode of a PD "$PD_P$" (1102) is connected to and emits current $i_{INP}$ into the input (1122) of another TIA (1120). The cathode of $PD_P$ is assumed to be held at a voltage, say 2.2 V, such that the voltage at the anode, say 0.7 V, as determined by the TIA is sufficient to keep the PD in reverse bias. Further, a feedback resistor (1125) is connected across the TIA, wherein the TIA input terminal (1121) and the TIA output terminal (1124) that go not carry signal from the PD are grounded. The active output terminal (1123) produces a voltage $V_{OUTP1}$, the difference between the two ungrounded outputs of the two TIAs will be $$V_{OUTD1} = V_{OUTP1} - V_{OUTN1}.$$

Figure 11B:
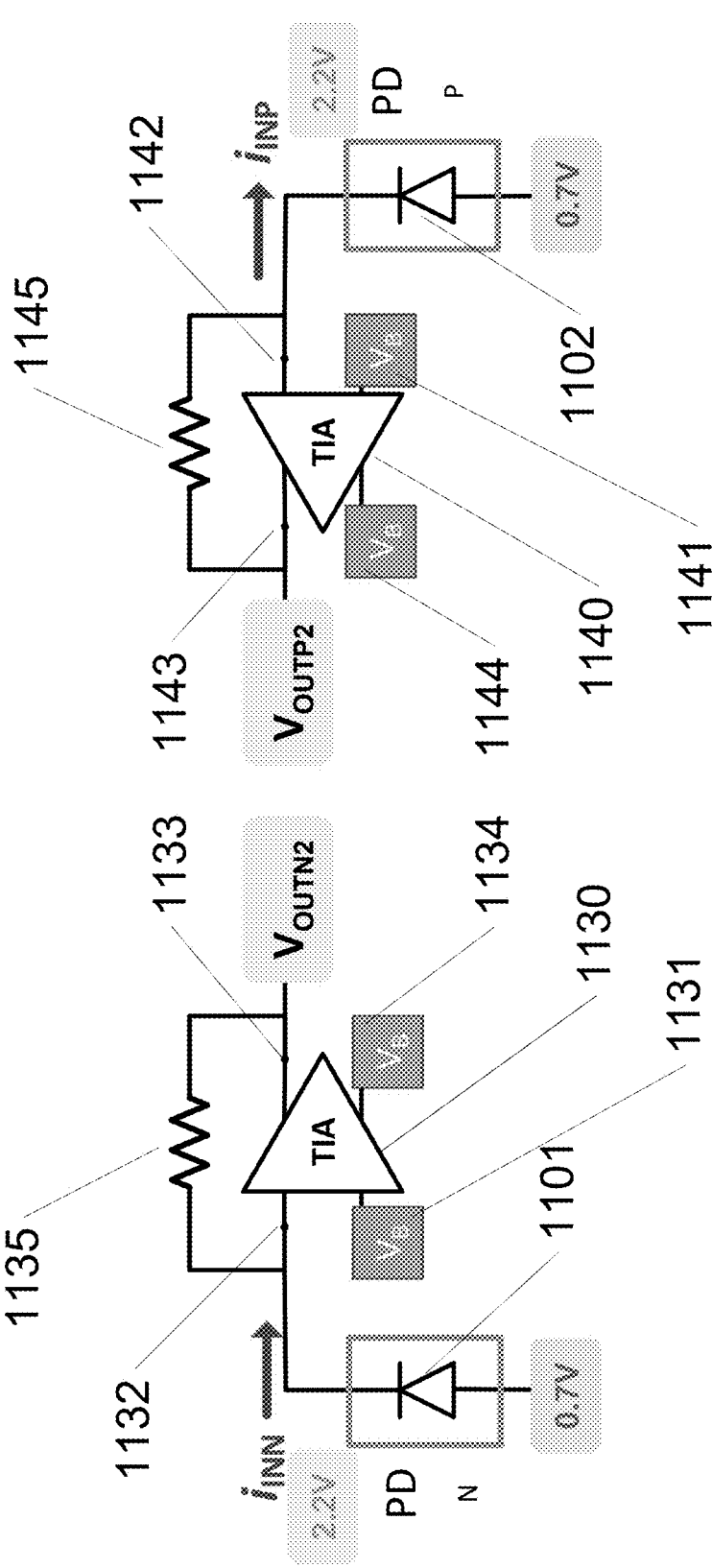
FIG. 11B is a diagram that depicts an exemplary embodiment of the current disclosure wherein two TIAs amplifying current from the cathodes of two matched PDs form the upper half of a 4QTIA and wherein the TIAs are level shifted such that the PDs' cathodes are held at a voltage appropriate for reverse bias.

In certain embodiments, a top half of a 4QTIA may be equivalent to a single traditional DTIA. In the embodiment of FIG. 11B, for example, wherein the cathode of a PD "$PD_N$" (1101) is connected to and emits current $i_{INN}$ into an input terminal (1132) of a TIA (1130), wherein the anode of $PD_N$ is assumed to be held at a voltage, say 0.7 V, such that the voltage at the cathode, say 2.2 V, as determined by the TIA is sufficient to keep the PD in reverse bias, wherein a feedback resistor (1135) is connected across the TIA, wherein the TIA input terminal (1131) and the TIA output terminal (1134) that do not carry signal from the PD are held at a voltage $V_B$ necessary to level-shift the TIA and produce the aforementioned voltage at the cathode of the PD, and wherein the active output terminal (1133) produces a voltage $V_{OUTN2}$, and wherein the anode of a PD "$PD_P$" (1102) is connected to and draws current $i_{INP}$ from an input terminal (1142) of another TIA (1140). The anode of $PD_P$ is assumed to be held at a voltage, about 0.7 V, such that the voltage at the cathode, about 2.2 V, as determined by the TIA is sufficient to keep the PD in reverse bias. Additionally, a feedback resistor (1145) is connected across the TIA, wherein the TIA input terminal (1141) and the TIA output terminal (1144) that do not carry signal from the PD are held at a voltage $V_B$ necessary to level-shift the TIA and produce the aforementioned voltage at the cathode of the PD. The active output terminal (1143) produces a voltage $V_{OUTP2}$, the difference between the two ungrounded outputs of the two TIAs will be $$V_{OUTD2} = V_{OUTP2} - V_{OUTN2}.$$

Figure 11C:
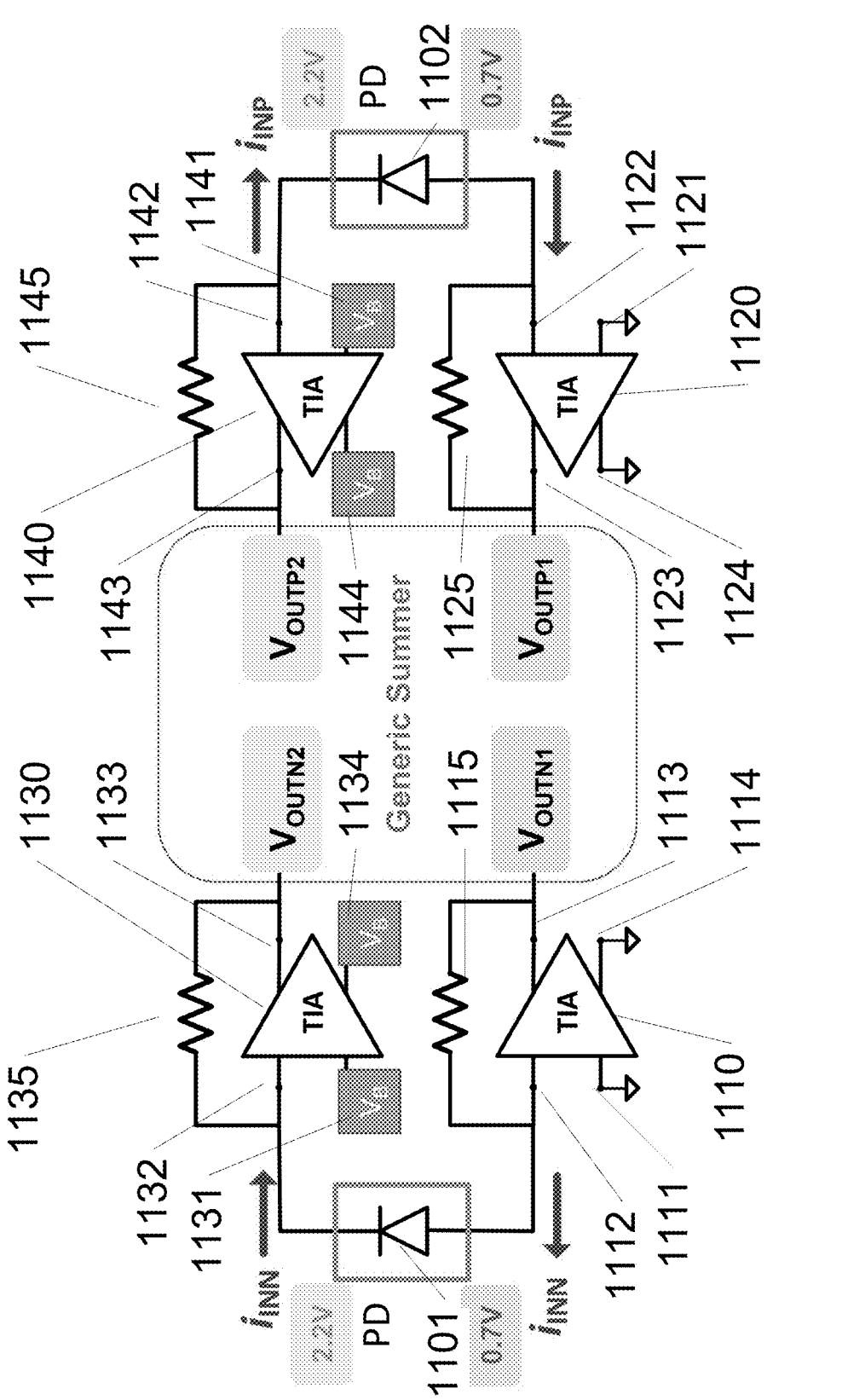
FIG. 11C is a diagram that depicts an exemplary embodiment of the current disclosure wherein the two exemplary embodiments of FIGS. 11A and 11B are combined into a 4QTIA such that the current from both terminals of both PDs are amplified and summed.

In certain embodiments, adding TIA outputs in phase may double the signal while boosting noise by only a factor of about $\sqrt{2}$, producing a 3 dB increase in SNR. For example, in the embodiment of FIG. 11C, wherein the top half (1130-1135, 1140-1145) and bottom half (1110-1115, 1120-1125) portions of a 4QTIA as described previously are combined such that a PD "$PD_N$" (1101) sits connected to the N input terminals (1112 and 1132) of two differential TIAs (1110 and 1120, 1130 and 1140) and a PD "$PD_P$" (1102) sits connected to the P input terminals (1122 and 1142) of the same two differential TIAs, the output voltages $V_{OUTN2}$ and $V_{OUTP1}$ will be of the same sign and the output voltages $V_{OUTN1}$ and $V_{OUTP2}$ will be of the same sign, and wherein the PDs are matched. In various embodiments, the signal and noise components of the output voltages will add according to their correlation coefficients as previously described to produce a 3 dB improvement in SNR as previously described.

Figure 12A:
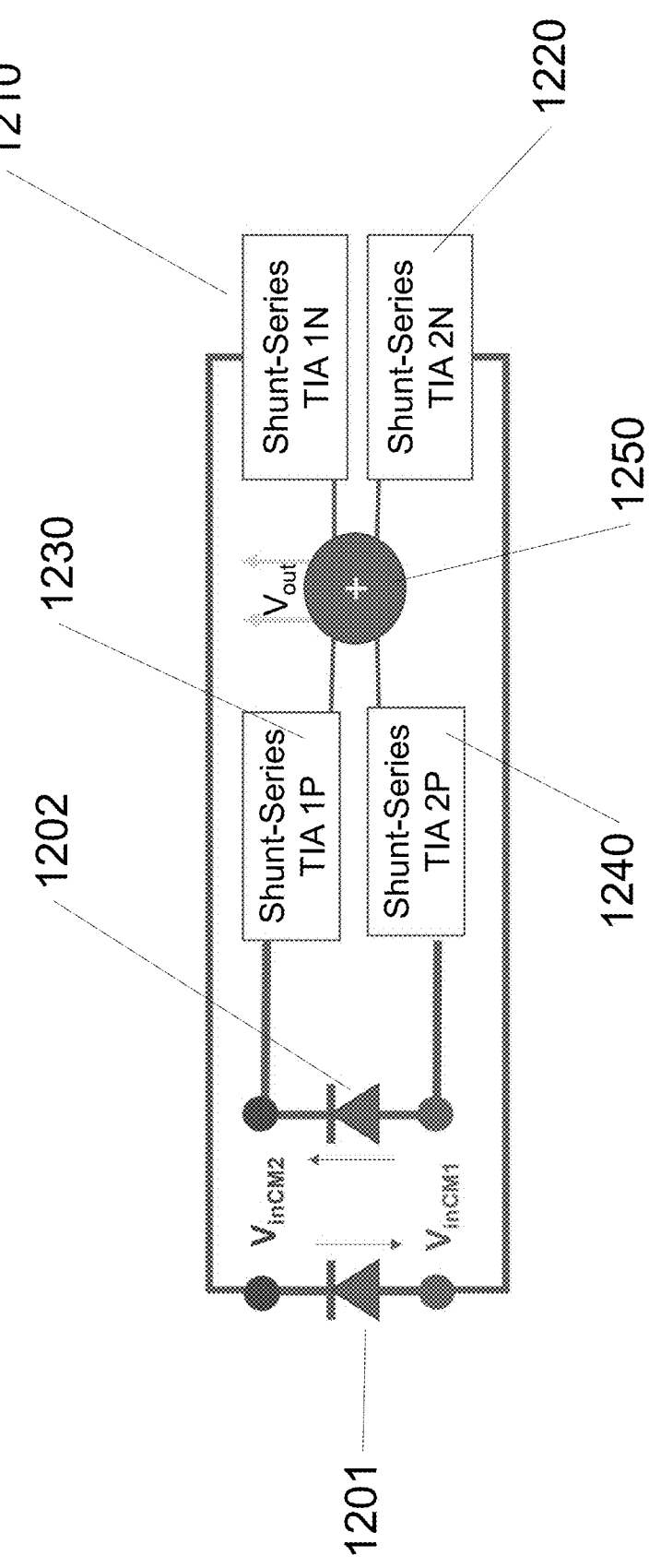
FIG. 12A is a diagram that depicts an exemplary embodiment of the current disclosure wherein each terminal of each of two PDs is amplified by a separate TIA, and wherein each TIA is implemented as a shunt-series TIA.
Figure 12B:
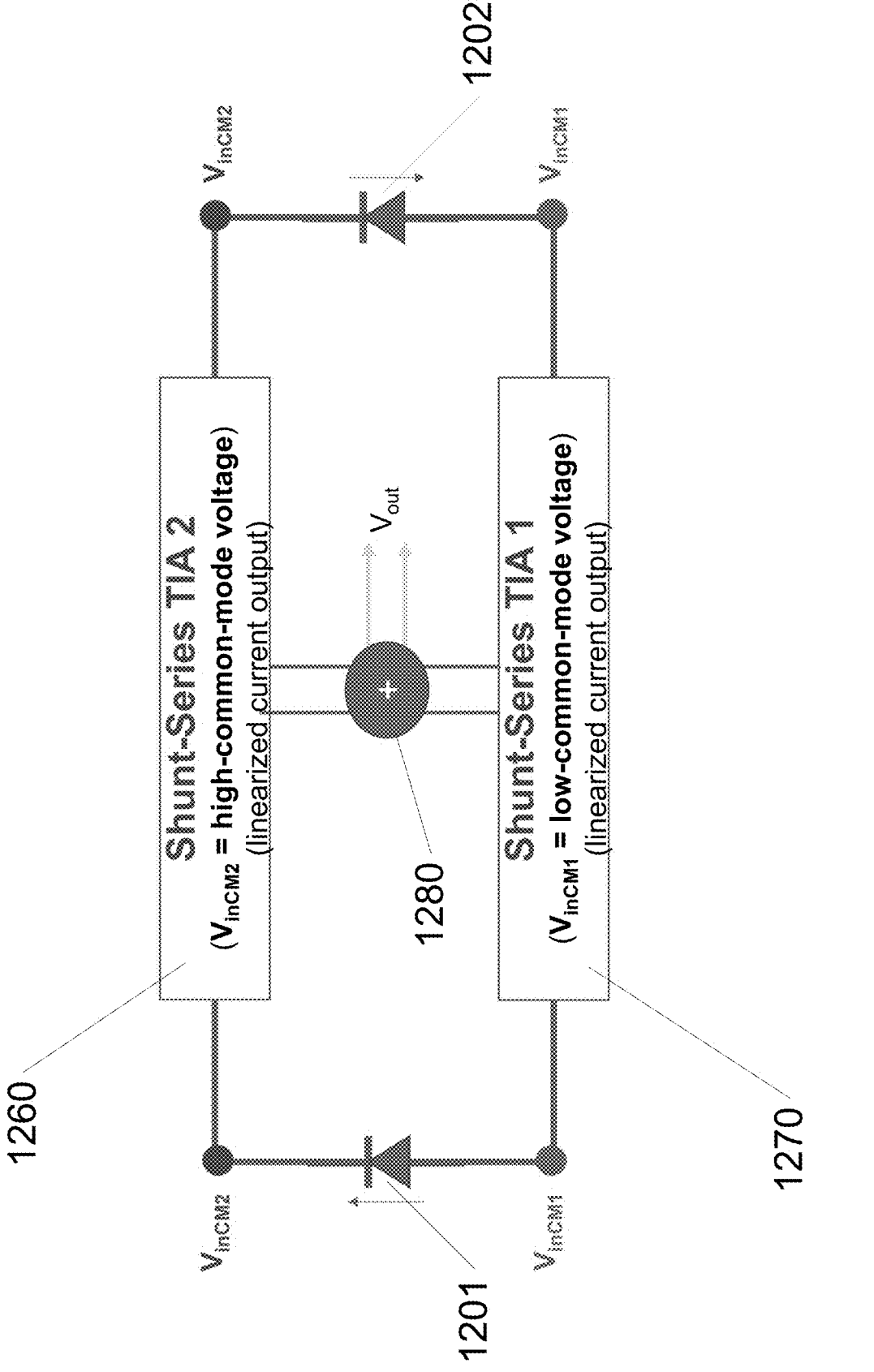
FIG. 12B is a diagram that depicts an exemplary embodiment of the current disclosure wherein each terminal of each of two PDs is amplified by a pair of differential TIAs, and wherein each TIA is implemented as a shunt-series TIA.

Refer now to the exemplary embodiments of FIGS. 12A and 12B a first PD (1201) and a second PD (1202) are shown in electrical communications with respective Shunt-Series TIAs (1210, 1220, 1230, and 1240). In some embodiments, an SETIA may be implemented as a shunt-series TIA; the shunt-series TIA generates a linearized output current, which is to say that output currents may be added simply by connecting output terminals with a wire. In other embodiments, a DTIA may be implemented as shunt-series TIAs arranged in a differential configuration. In other embodiments, a 4QTIA may be implemented as stacked shunt-series TIAs. The outputs of the four TIAs are connected to a Vout 1250 in some embodiments. In most embodiments, any implementation of TIA may be used with any variety of signal summer. In the embodiment, of FIG. 12B, two shunt series TIAs (1260, 1270) are in electrical communication with PDs (1201, 1202) as shown. The outputs of the two TIAs are connected to a Vout 1280 in some embodiments.

Figure 13A:
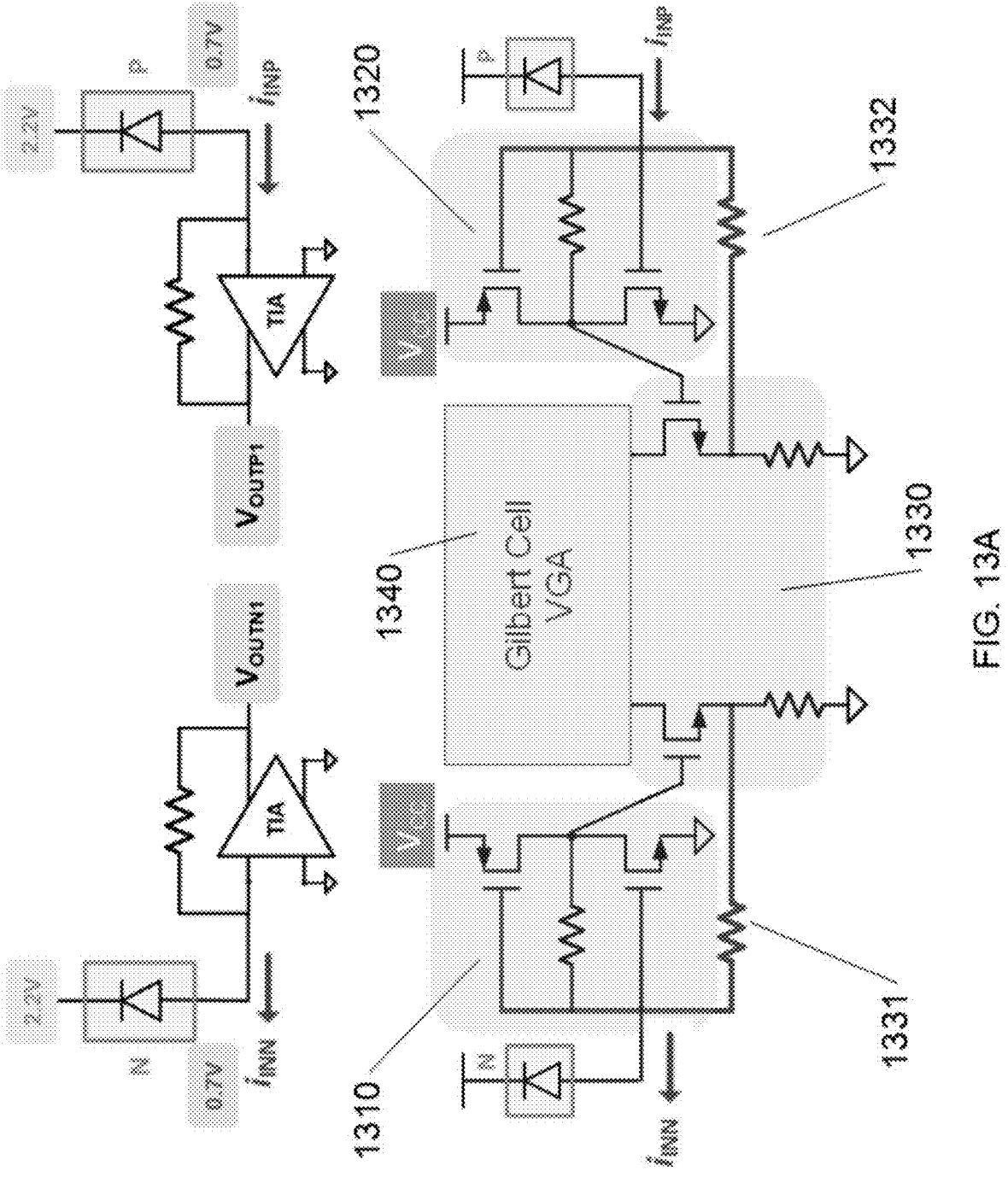
FIG. 13A is a diagram that depicts an exemplary embodiment of the current disclosure wherein the exemplary embodiment of FIG. 11A is implemented such that a CMOS-inverter TIA, appropriately level-shifted by grounding, converts the current from the anode of each PD to a voltage, wherein the voltages are amplified by an NMOS-$g_m$ stage and a Gilbert Cell variable gain amplifier (VGA), wherein a shunt resistor sits between each CMOS-inverter TIA and the NMOS-$g_m$ stage.
Figure 13B:
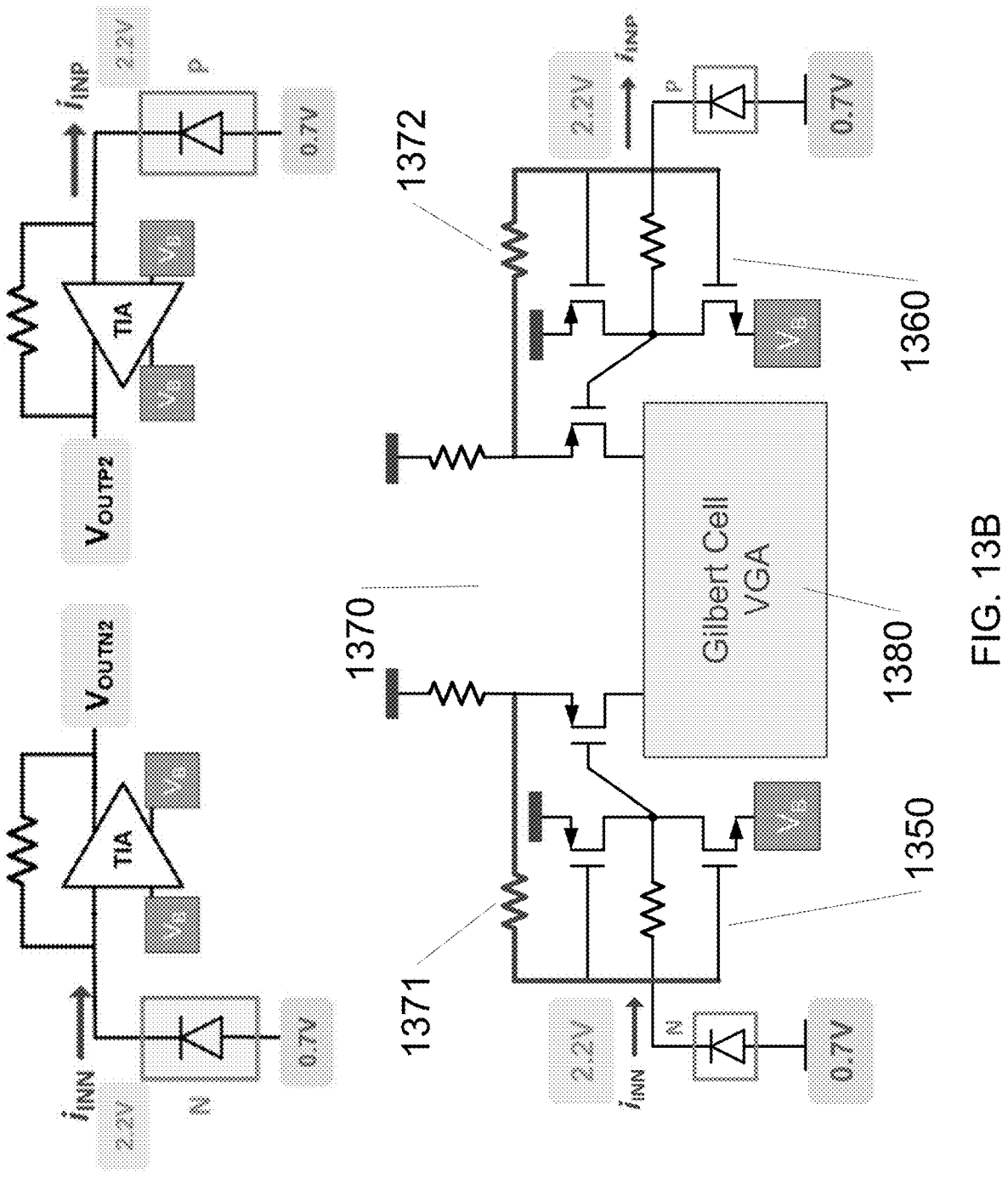
FIG. 13B is a diagram that depicts an exemplary embodiment of the current disclosure wherein the exemplary embodiment of FIG. 11B is implemented such that a CMOS-inverter TIA, appropriately level-shifted by a voltage $V_B$, converts the current from the anode of each PD to a voltage, wherein the voltages are amplified by an PMOS-$g_m$ stage and a Gilbert Cell variable gain amplifier (VGA), wherein a shunt resistor sits between each CMOS-inverter TIA and the PMOS-$g_m$ stage.
Figure 13C:
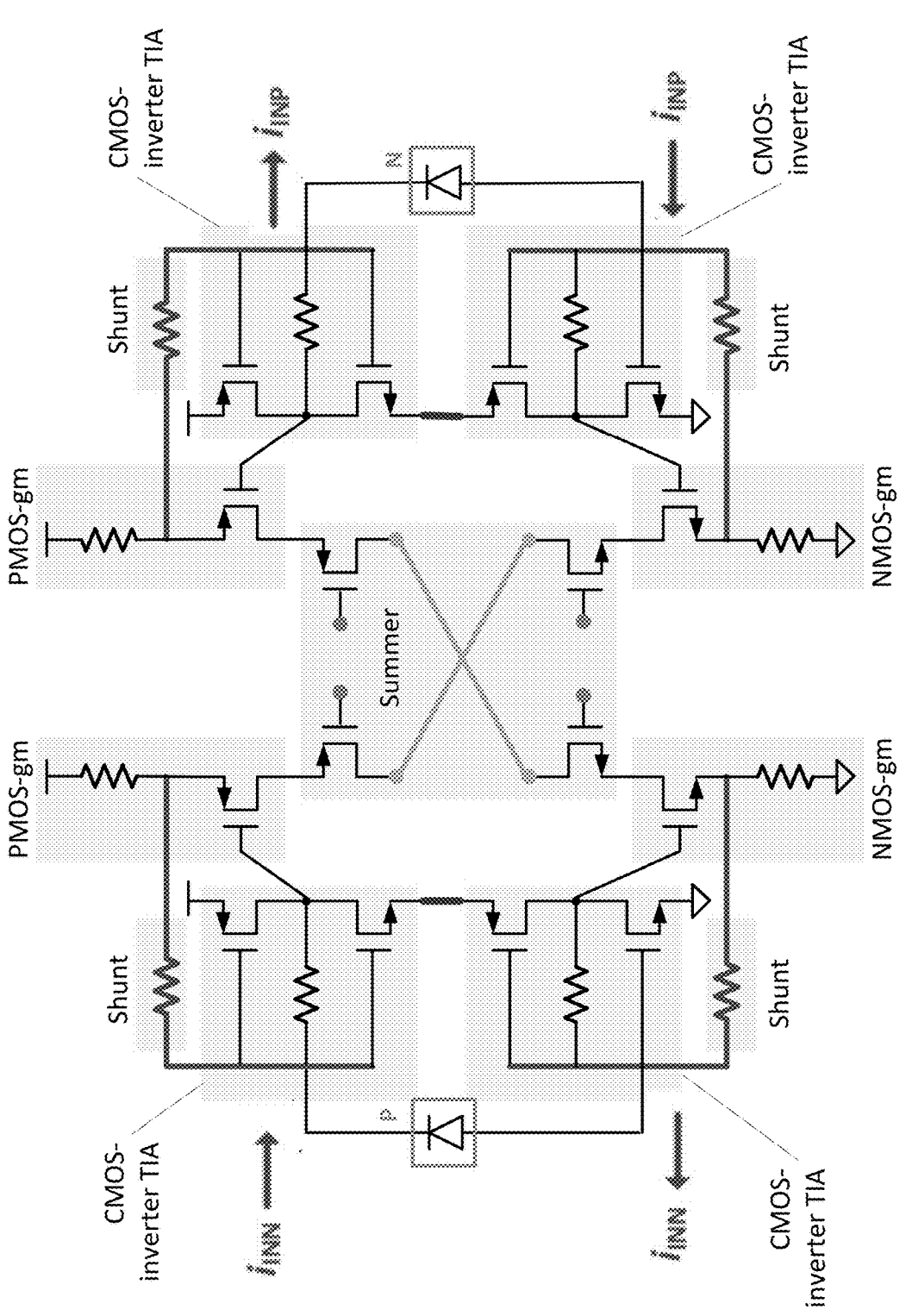
FIG. 13C is a diagram that depicts an exemplary embodiment of the current disclosure wherein the exemplary embodiments of FIGS. 11A and 11B are combined or wherein the exemplary embodiments of FIGS. 13A and 13B are combined such that a linearized output current is produced as an amplification of the current of each terminal of each PD and wherein the amplified currents are summed into a differential by connection of in-phase outputs with wires.

Refer now to the exemplary embodiments of FIGS. 13A, 13B, and 13C. FIG. 13A is a diagram that depicts an exemplary embodiment of the current disclosure wherein the exemplary embodiment of FIG. 11A is implemented such that a CMOS-inverter TIA (1310 and 1320), appropriately level-shifted by grounding, converts the current from the anode of each PD to a voltage, wherein the voltages are amplified by an NMOS-$g_m$ stage (1330) and a Gilbert Cell variable gain amplifier (VGA, 1340), wherein a shunt resistor (1331 and 1332) sits between each CMOS-inverter TIA and the NMOS-$g_m$ stage.

FIG. 13B is a diagram that depicts an exemplary embodiment of the current disclosure wherein the exemplary embodiment of FIG. 11B is implemented such that a CMOS-inverter TIA (1350 and 1360), appropriately level-shifted by a voltage $V_B$, converts the current from the anode of each PD to a voltage. In various embodiments, the voltages are amplified by a PMOS-$g_m$ stage (1370) and a Gilbert Cell variable gain amplifier (VGA, 1380), wherein a shunt resistor (1371 and 1372) sits between each CMOS-inverter TIA and the PMOS-$g_m$ stage. FIG. 13C is a diagram that depicts an exemplary embodiment of the current disclosure wherein the exemplary embodiments of FIGS. 11A and 11B are combined or wherein the exemplary embodiments of FIGS. 13A and 13B are combined such that a linearized output current is produced as an amplification of the current of each terminal of each PD and wherein the amplified currents are summed into a differential by connection of in-phase outputs with wires.

In some embodiments, the arrangement of transistors in four groups as shown (top right, top left, bottom right, bottom left), and the various resistors and other components show may be referred to as Four-Quadrant Stacked-Shunt-Series TIA. The Four-Quadrant Stacked-Shunt-Series TIA is an exemplary symmetric optoelectronic transducer and one or multiples of these transducers may be fabricated on or in one or more semiconductor layers. All of the embodiments disclosed herein may be fabricated one or in various substrates using etching, growth, and deposition processes. Silicon, silicon nitride, silicon on insulator, and other semiconductors may be used to fabricate the embodiments disclosed herein.

In some embodiments, the current disclosure may enable a four-quadrant transimpedance amplifier (4QTIA) fabricated using a silicon-on-insulator processing technology such as a fully-depleted silicon-on-insulator process. In other embodiments, the current disclosure may enable a 4QTIA in any CMOS technology node.

In some embodiments, the current disclosure may be used in an optical receiver capable of receiving a 126 gigabaud, 16QAM signal for a net bit rate of about 800 gigabits per second.

Figure 14:
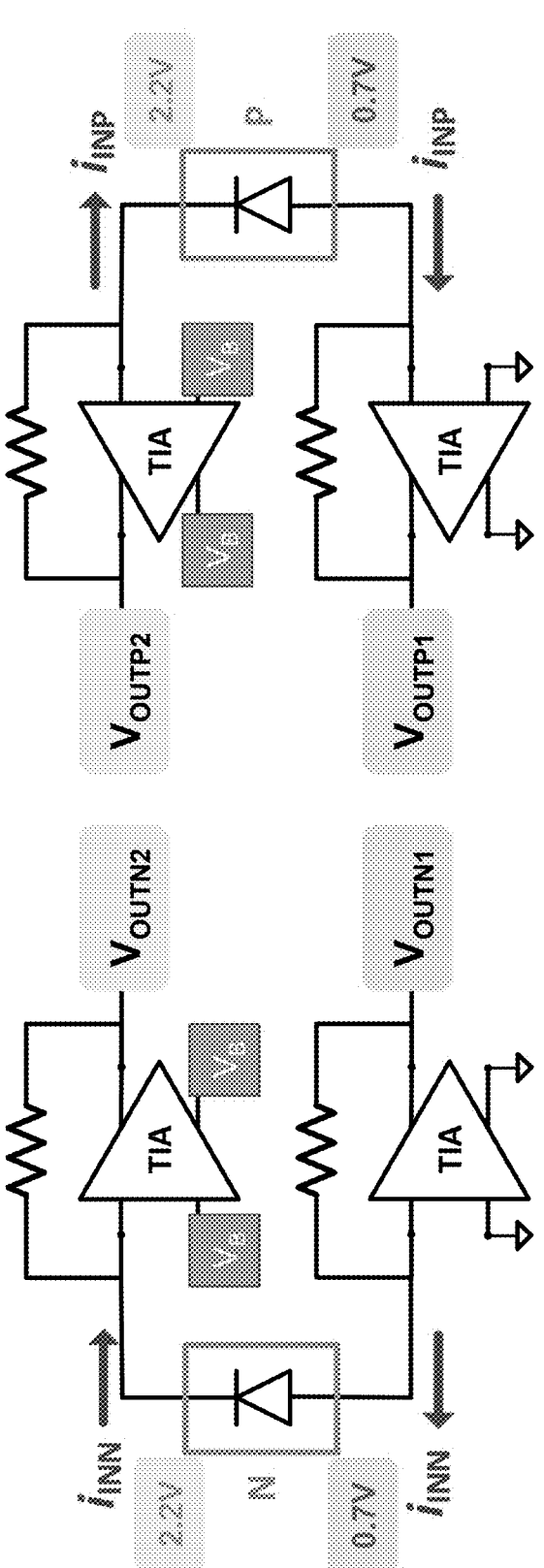
FIG. 14 is a circuit diagram of an exemplary embodiment of the current disclosure depicting an optoelectronic transducer that include two photodiodes and four TIAs in a symmetric configuration in accordance with one or more aspects of the disclosure.

FIG. 14 is a circuit diagram of an exemplary embodiment of the current disclosure depicting an optoelectronic transducer that includes two photodiodes and four TIAs in a symmetric configuration. The two photodiodes are reversed bias by a pair of TIAs as shown. The input currents are converter to output voltages as shown. In other embodiments, currents may be output.

Figure 15A:
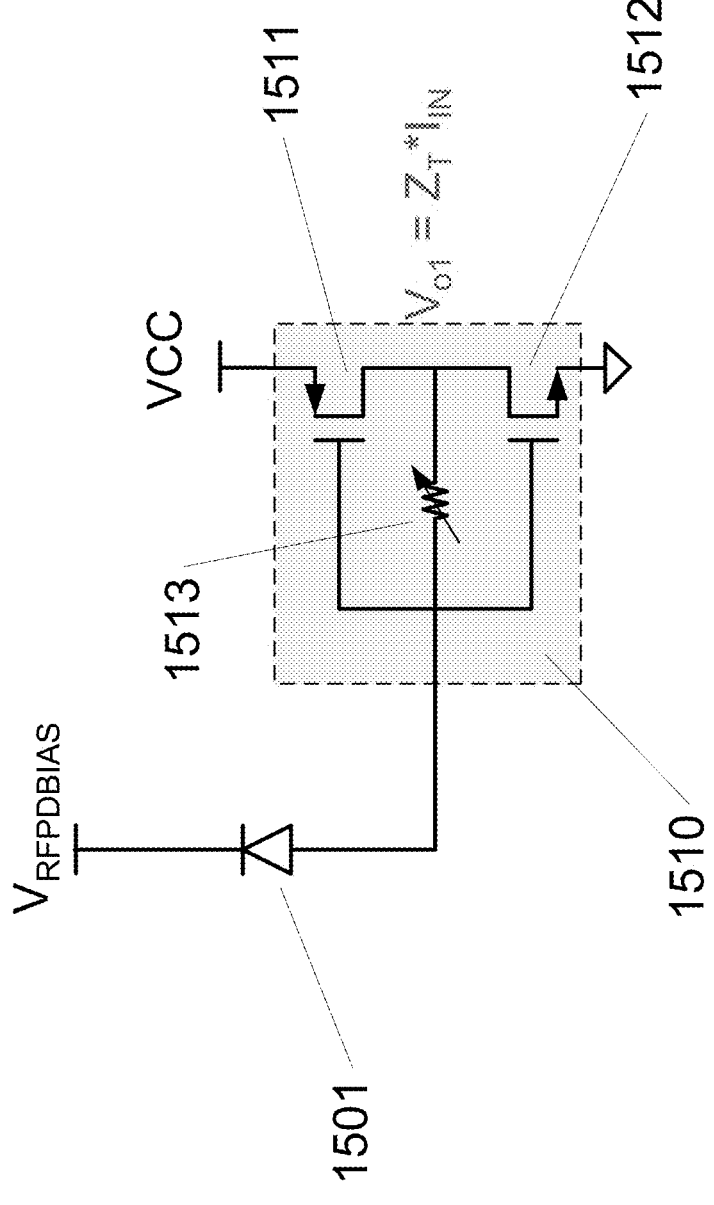
FIG. 15A is a diagram that depicts an exemplary embodiment of the current disclosure wherein only the anode of a PD is amplified by a CMOS-inverter TIA in a configuration sufficient for a PAM4 receiver application.
Figure 15B:
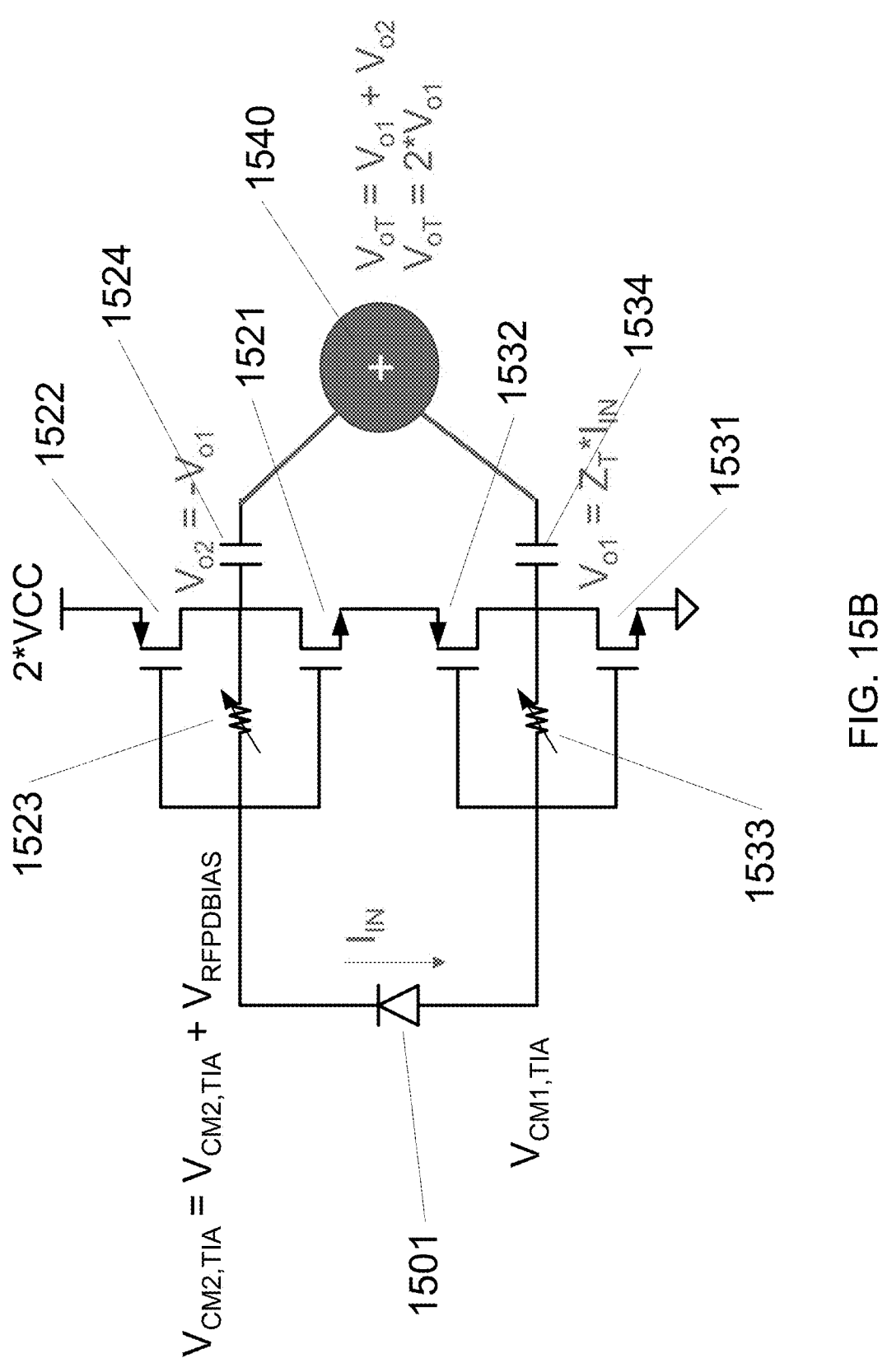
FIG. 15B is a diagram that depicts an exemplary embodiment of the current disclosure wherein both terminals of a PD are amplified, each by a CMOS-inverter TIA, wherein the output of each amplification stage is capacitively coupled to a summer. This exemplary embodiment may enable a PAM4 receiver wherein information is not encoded in the phase of a carrier signal.

In some embodiments, the current disclosure may be used in a PAM4 optical receiver with active reverse-bias of photodetectors for signal amplification from both the cathode and anode terminals. Refer now to the example embodiments of FIG. 15A and FIG. 15B, where FIG. 15A illustrates a PD (1501) amplified at only one terminal by a CMOS inverter TIA (1510), composed of one PMOS transistor (1511), one NMOS transistor (1512), and variable resistor (1513), and where FIG. 15B illustrates a PD (1501) amplified at both terminals by two CMOS inverter TIAs, each composed of a PMOS (1522 and 1532), an NMOS (1521 and 1531), a variable resistor (1523 and 1533). Each CMOS inverter TIA is capacitively coupled (1524 and 1534) into a summer (1540). As the PAM4 encoding does not encode any information in the phase of a carrier signal, one diode is present in some of these embodiments and no differential output is produced.

In some embodiments, the current disclosure may enable a high-frequency SNR-boosted four-quadrant TIA (4QTIA) using photocurrent pre-emphasis. In many embodiments, legacy solutions may not amplify and instead may bias one terminal of a PD, thus wasting current over decoupling capacitors. In some embodiments, current otherwise wasted may be amplified by a current buffer, sent through a high-pass filter (HPF) and added to the main TIA response, resulting in an improvement of SNR at high frequencies. The HPF may have various implementations and may reintroduce the filtered signal at multiple locations in the circuit, such as before the TIA, in the feedback path of the TIA, or after the TIA.

Figure 16A:
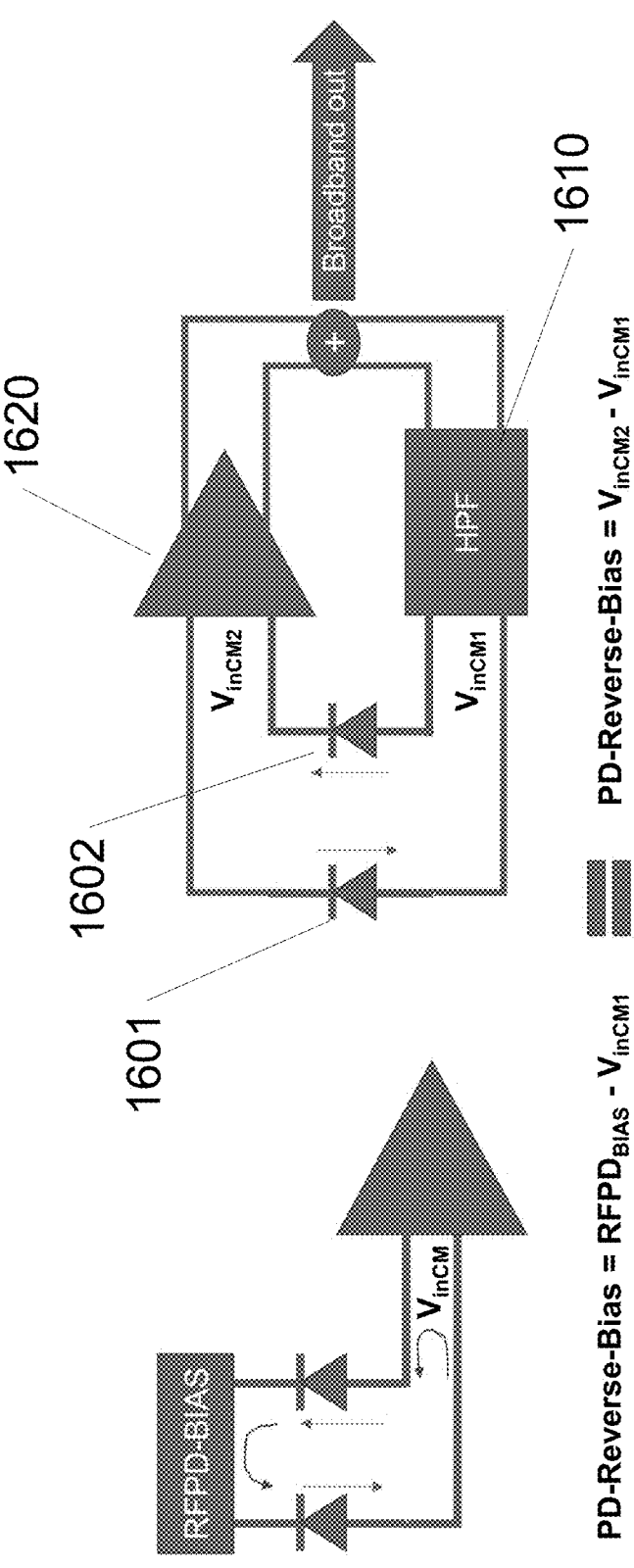
FIG. 16A is a diagram that depicts an exemplary embodiment of the current disclosure wherein a high-pass filter couples current filtered from the anodes of two PDs after the output of a TIA which amplifies current from the cathodes of the two PDs.
Figure 16B:
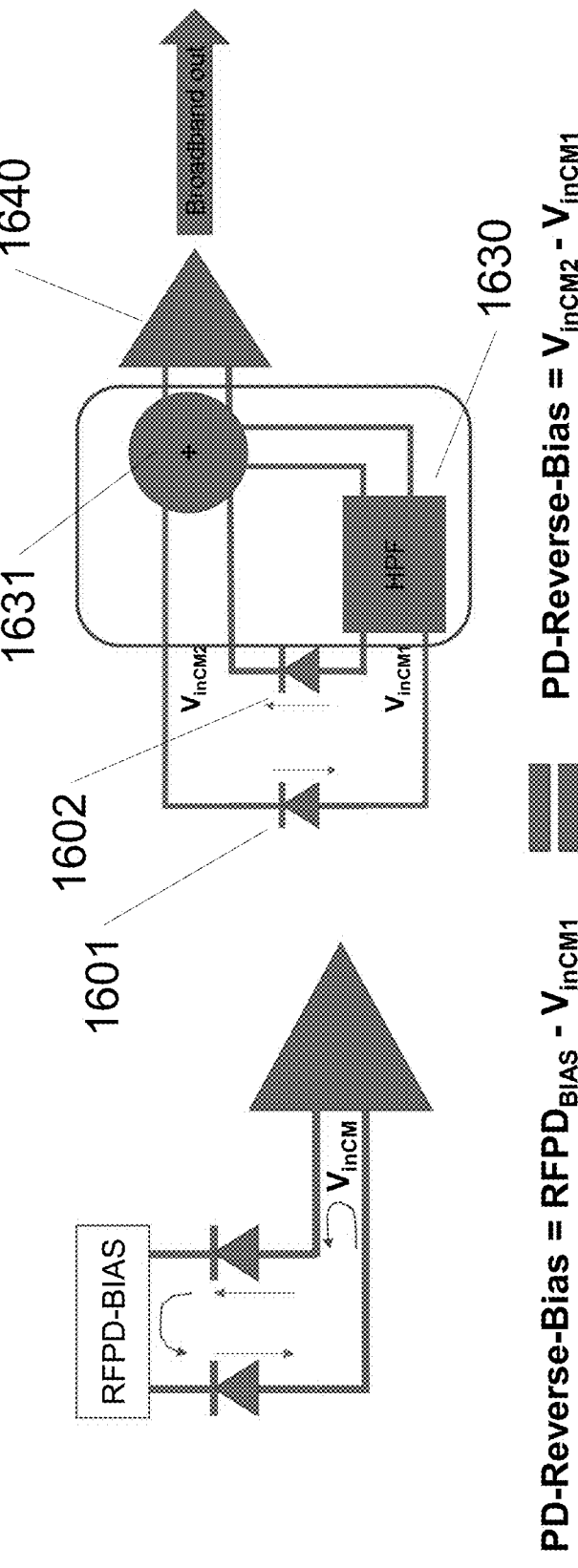
FIG. 16B is a diagram that depicts an exemplary embodiment of the current disclosure wherein a high-pass filter couples current filtered from the anodes of two PDs before the output of a TIA which amplifies current from the cathodes of the two PDs.

The embodiment of FIG. 16A, for example, shows the HPF (1610), filtering current from PDs (1601 and 1602), arranged to add its output after that of the TIA (1620). Any configuration and any implementation of TIA and HPF may set the common-mode voltages of their inputs such that the reverse bias conditions are identical to that of a circuit configuration amplifying only one terminal of each PD. In certain embodiments, the location at which current is added by an HPF will depend on the phase response of the TIA and the type of HPF used. The example embodiment of FIG. 16B shows an HPF (1630), filtering current from PDs (1601 and 1602), arranged to add (1631) current before the TIA (1640), i.e. at the TIA inputs.

In some embodiments, such a configuration may raise the RF operating frequency and extend the bandwidth. In various embodiments, such a configuration, wherein current is added at the TIA inputs, may be realized with coupled lines for off-chip PDs located at some distance away from the TIAs, or use transformers for a flip-chip interconnection. In some embodiments, the HPF may add signal into the feedback path of the TIA, as shown, for example, in the embodiment of FIG. 16C wherein a current buffer (1650) buffers current from PDs (1601 and 1602) and wherein transformers (1663 and 1664) are used to couple a signal from the current buffer into the feedback path, including feedback resistors (1661 and 1662), of the TIA (1660). Such a configuration may likewise improve the RF operating frequency and extend the bandwidth of the device as compared to a circuit configuration using an external bias and amplifying only a single terminal of each PD, as shown, for example, in the embodiment of FIG. 16D wherein the frequency response of each configuration is plotted relative to V (dB) and the bandwidth of the HPF-based configuration may be seen to be wider. Current from the PD anodes is

Figure 16C:
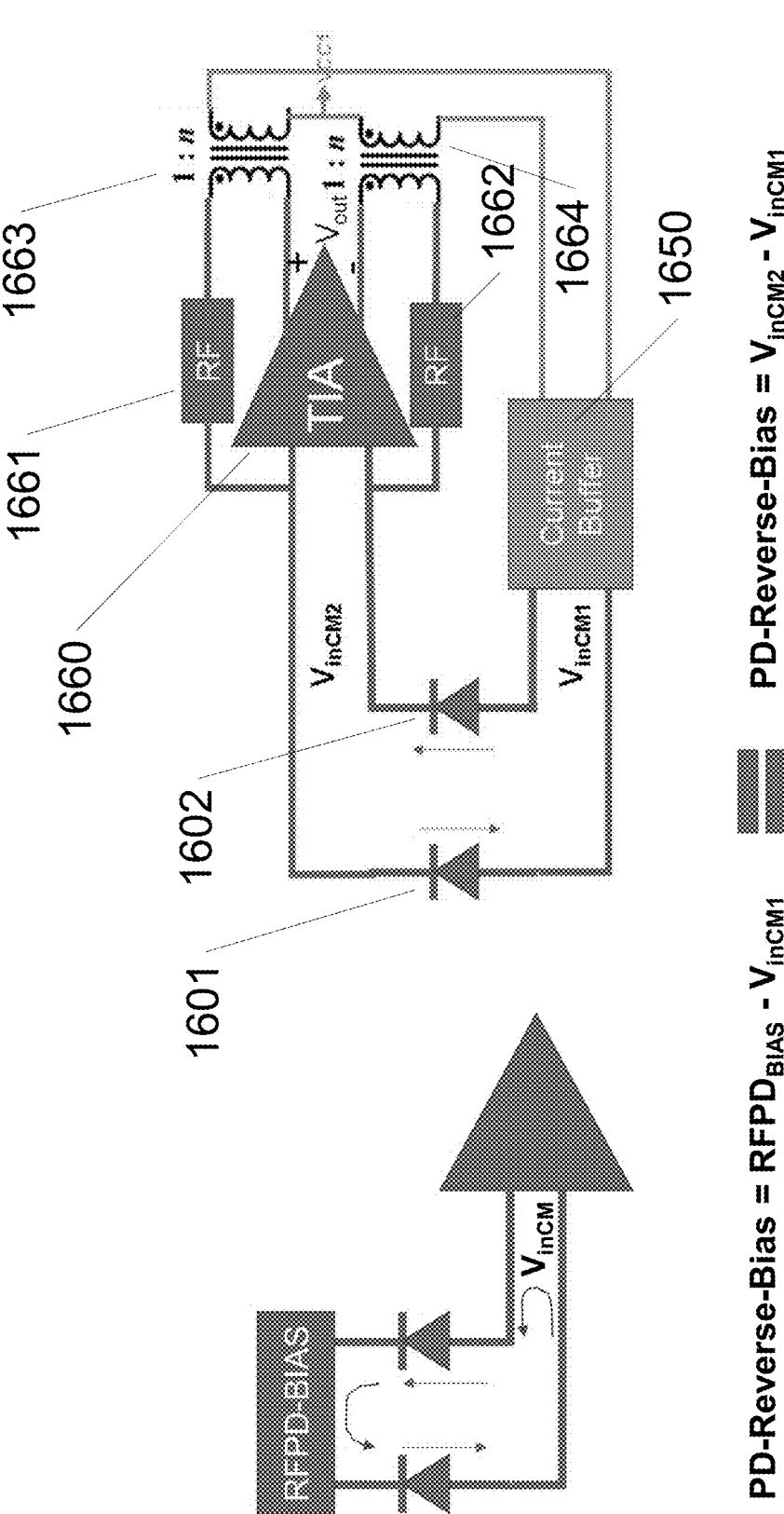
FIG. 16C is a diagram that depicts an exemplary embodiment of the current disclosure wherein the current from the cathodes of two PDs is amplified by a TIA and a current buffer couples current from the anodes of the PDs into the feedback path of the TIA.
Figure 16D:
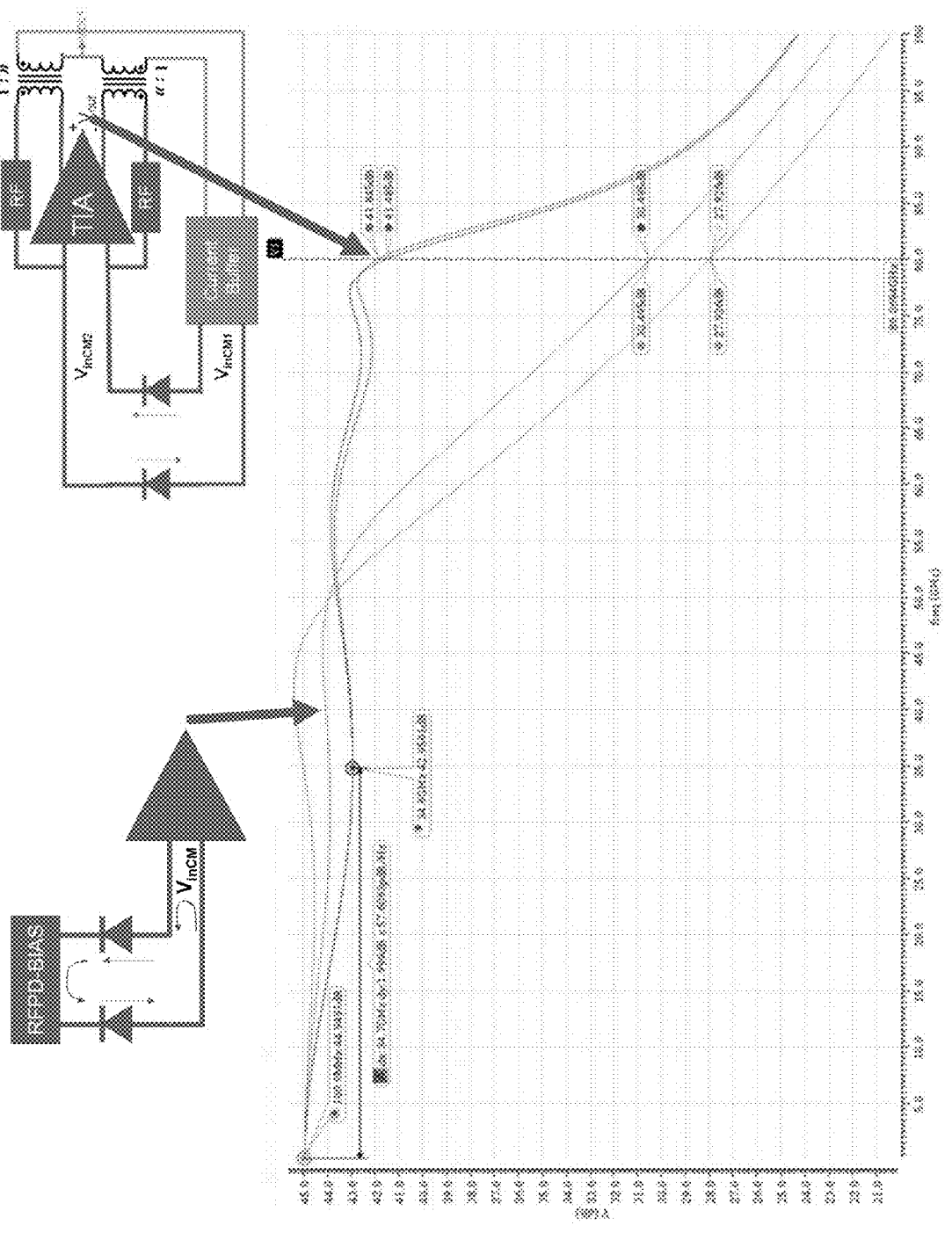
FIG. 16D is a diagram that depicts an exemplary embodiment of the current disclosure wherein the frequency response of the exemplary embodiment of FIG. 16C is compared with another approach to PD amplification.

15 amplified in embodiment of FIG. 16D. As shown in FIG. 16D, an additional signal can be added at high-frequencies to boost bandwidth (and SNR) at high frequencies.

Use of the current buffer, as in the embodiment of FIG. 16C, increases the frequency at which the nominal voltage gain begins to drop off.

Figure 17A:
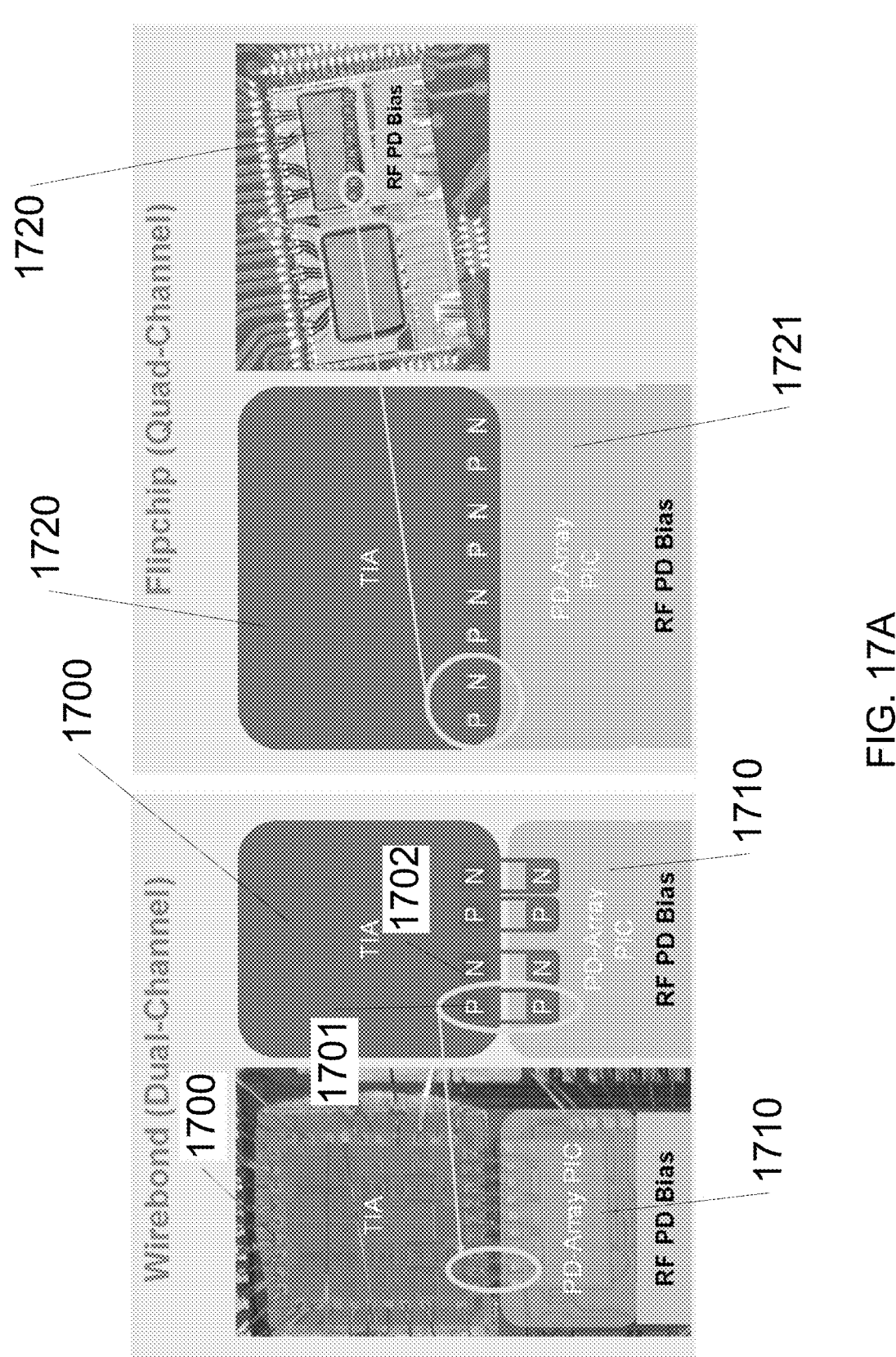
FIG. 17A is a diagram that depicts an exemplary embodiment of the current disclosure wherein a PDs integrated into a PD array are amplified only at one terminal each.
Figure 17B:
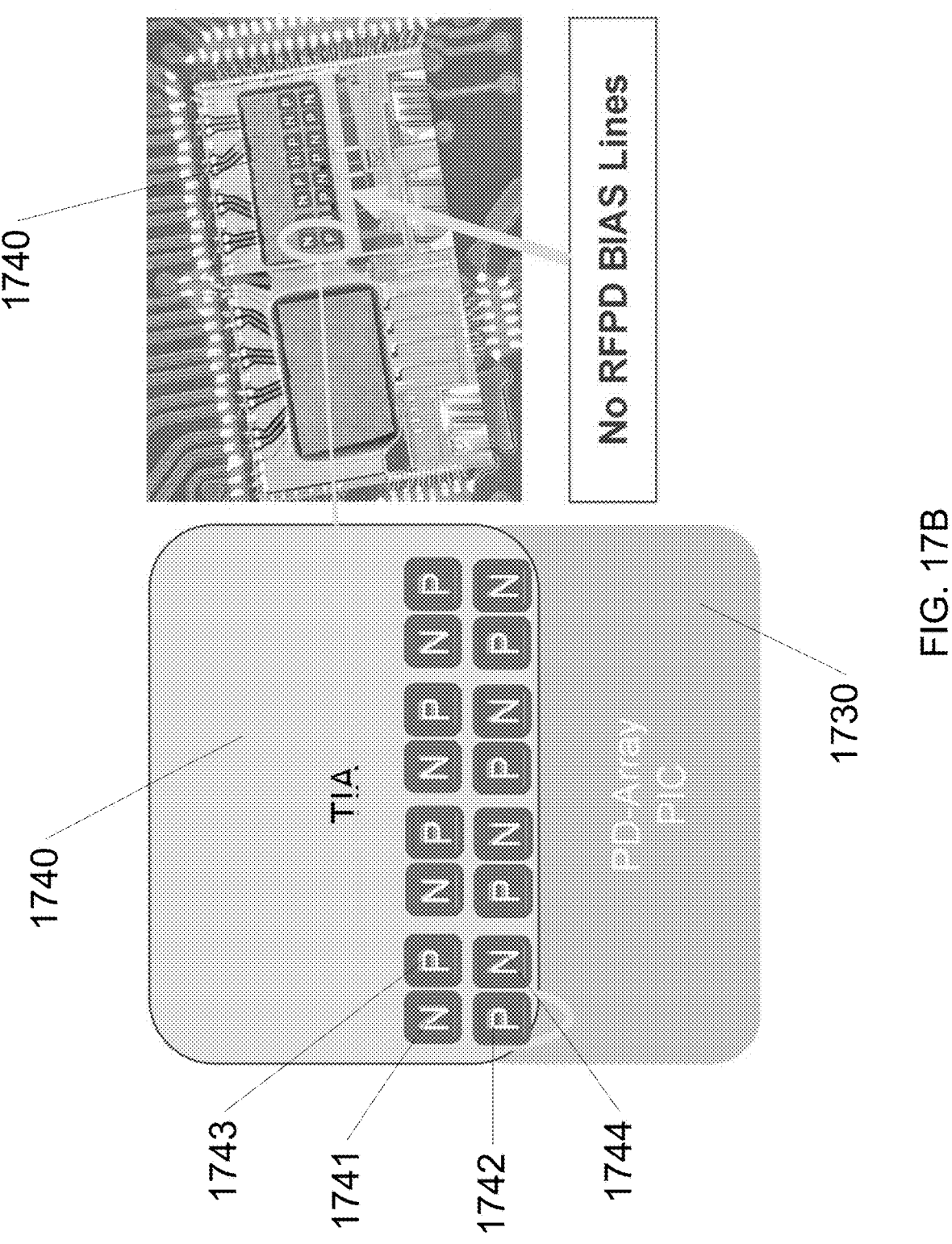
FIG. 17B is a diagram that depicts an exemplary embodiment of the current disclosure wherein a PD array is connected to a separate die containing TIAs and wherein current from both terminals of each PD is amplified.

Refer now to the example embodiments of FIG. 17A, a diagram that depicts PDs integrated into a PD array are amplified only at one terminal each are shown. In this embodiment, the PD array may be connected to a separate die containing TIAs by wirebonding 1700 or by a flipchip interconnections (shown on left). The cathode (P) to cathode (P) connections 1701 between the TIA 1700 and the PD array on the PIC 1710 may be made by wirebonds. Similarly, the anode (N) to anode (N) connections 1702 between the TIA 1700 and the PD array on the PIC 1710 may be made by wirebonds. In other embodiments, the wirebond may be replaced with conductive pillars and the PDs and cathode (P) and anode (N) terminals of TIA 1720 may be connected to PIC 1721 using a flipchip arrangement FIG. 17B is a diagram that depicts an exemplary embodiment of the current disclosure wherein a PD array is connected to a separate die containing TIAs 1740 and wherein current from both terminals of each respective PD (1741, 1742, 1743, and 1743) is amplified. The PD are in an array on a PIC 1730 and may be wirebonded to corresponding terminals on TIA 1740 as shown by alternating P and N terminal connections between a given TIA terminal and a given PD A or P terminal.

In many embodiments, the interconnection between the PDs and TIAs may require two connections to a TIA per PD. This interconnection or electrical coupling can be achieved using various techniques. For example, wirebonding, using two bond wires per PD, i.e. one bond wire for the cathode and one bond wire for the anode may be used for electrical coupling of wires, terminals, etc., as disclosed herein. The PD-TIA interconnection can also be achieved using by a flip-chip configuration, such as a stacked or overlapping arrangement of elements, using two copper pillars (CuP) per PD, one CuP for the cathode and one CuP for the anode. The flip-chip method may be advantageous by reducing unwanted inductances in various optoelectronic transducers and optical receivers incorporating the same.

ADDITIONAL EMBODIMENTS AND FEATURES

In certain embodiments, the current disclosure has realized that that there may be a SNR limitation of using only one terminal of a photodetector. In many embodiments, the current disclosure has realized that using both terminals may boost SNR by 3 dB. In certain embodiments, boosting SNR may improve fundamental sensitivity of a receiver. In almost all embodiments, it may be possible to take a receiver using only one of the two terminals on the PD (such as an ANODE terminal and analog-gnd the cathode to a Voltage) than improve the receiver sensitivity (by improving SNR) by using both cathode and anode of the receiver.

In some embodiments, improvement of sensitivity may be helpful in single-photodiode applications like PAM4 direct detect and in differential photodetectors like coherent applications. In certain embodiments, the current disclosure may enable an Optical Receiver with Photocurrent Amplification from both PD-Cathode and PD-Anode Terminals Using Level-Shifted TIAs. In certain embodiments, the current disclosure may enable an Active Reverse-Bias of Photodetectors For Signal Amplification from cathode and anode terminals of PDs or other devices or detectors. In some embodiments, the current disclosure may enable a PAM4 OPTICAL RECEIVER with Active Reverse-Bias of Photodetector for Signal Amplification from both Cathode and Anode terminal. In some embodiments, the current disclosure may enable a 140 GB TIA Broadband SNR-Boosted Four-Quadrant TIA.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor (DSP). In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within 20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. An optical transducer comprising:
a first photodiode comprising a first anode and first cathode; and
a second photodiode comprising a second anode and a second cathode,
wherein the first anode is coupled to a first transimpedance amplifier (TIA) and the first cathode is coupled to a second TIA, wherein the first and second TIAs are configured to reverse bias the first photodiode;
wherein the second anode is coupled to a third TIA and the second cathode is coupled to a fourth TIA, wherein the third and fourth TIAs are configured to reverse bias the second photodiode.

2. The optical transducer of claim 1, wherein each of the first, second, third, and fourth TIAs is a single ended transimpedance amplifier.

3. The optical transducer of claim 1, wherein of the first, second, third, and fourth TIAs are part of two differential transimpedance amplifiers, wherein each of the differential transimpedance amplifiers comprises two inputs, wherein there is a 180 degree phase offset between the two differential transimpedance amplifiers.

4. The optical transducer of claim 3, wherein a first input of one of the differential transimpedance amplifiers is electrically coupled to the first anode of the first photodiode, wherein a second input of one of the differential transimpedance amplifiers is electrically coupled to the second cathode of the second photodiode.

5. The optical transducer of claim 1, further comprising a summing circuit in electrical communication with the first, second, third, and fourth TIAs.

6. The optical transducer of claim 1, wherein the reverse biasing of the first photodiode increases signal to noise ratio of the optical transducer by a value that ranges from about 0.5 dB to about 3 dB.

7. The optical transducer of claim 1, wherein one or more electrical connections between the first photodiode and first and second TIAs are wirebonds.

8. The optical transducer of claim 1, wherein the first photodiode and the second photodiode comprise one or more semiconductor structures or layers disposed on or in a semiconductor substrate, wherein capacitance of the semiconductor substrate ranges from about 15 Femtofarads to about 30 Femtofarads.

9. The optical transducer of claim 8, wherein the semiconductor substrate is silicon, silicon on insulator, silicon oxide or silicon nitride.

10. The optical transducer of claim 1, wherein the first, second, third, and fourth TIAs are part of one four quadrant TIA, wherein the four quadrant TIA comprises one or more complementary metal-oxide-semiconductor inverter TIAs and one or more voltage to current converters.

11. The optical transducer of claim 1, further comprising a photonic integrated circuit, the photonic integrated circuit comprising the first photodiode, the second photodiode, and the first, second, third, and fourth TIAs.

12. The optical transducer of claim 1, further comprising a high pass filter in electrical communication with the first photodiode and the second photodiode.

13. The optical transducer of claim 1, wherein electrical connections to terminals to which the first, second, third, and fourth TIAs connects are symmetric.

14. An optical transducer comprising:
a transimpedance amplifier comprising first, second, third, and fourth electrical terminals;
a semiconductor substrate;
a first photodiode comprising a first anode and first cathode; and
a second photodiode comprising a second anode and a second cathode,
wherein the first anode is coupled to the first terminal and the first cathode is coupled to the second terminal and the second anode is coupled to the third terminal and the second cathode is coupled to the fourth terminal,
wherein the first anode and first cathode are reversed biased by the transimpedance amplifier;
wherein the second anode and the second cathode are reversed biased by the transimpedance amplifier.

15. An optical transducer comprising:
one or more transimpedance amplifiers (TIAs); and
a photodiode comprising an anode and a cathode,
wherein the anode is coupled to the one or more TIAs and the cathode is coupled to the one or more TIAs, wherein the one or more TIAs are configured to reverse bias the photodiode.

16. The optical transducer of claim 15, wherein the one or more TIAs comprises a single TIA coupled to both the anode and the cathode.

17. The optical transducer of claim 15, wherein the one or more TIAs comprises at least two TIAs, wherein the anode is coupled to a first one of the at least two TIAs and the cathode is coupled to a second one of the at least two TIAs.

18. The optical transducer of claim 17, further comprising:

a second photodiode comprising a second anode and a second cathode, wherein the second anode is coupled to the first one of the at least two TIAs and the second cathode is coupled to the second one of the at least two TIAs, wherein the at least two TIAs are configured to reverse bias the second photodiode.

* * * * *